(12) United States Patent
Saitoh et al.

(10) Patent No.: US 12,396,339 B2
(45) Date of Patent: Aug. 19, 2025

(54) DISPLAY DEVICE AND METHOD FOR MANUFACTURING SAME

(71) Applicant: SHARP KABUSHIKI KAISHA, Sakai (JP)

(72) Inventors: Takao Saitoh, Sakai (JP); Masahiko Miwa, Sakai (JP); Masaki Yamanaka, Sakai (JP); Yohsuke Kanzaki, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 525 days.

(21) Appl. No.: 17/913,650

(22) PCT Filed: Apr. 9, 2020

(86) PCT No.: PCT/JP2020/015976
§ 371 (c)(1),
(2) Date: Sep. 22, 2022

(87) PCT Pub. No.: WO2021/205603
PCT Pub. Date: Oct. 14, 2021

(65) Prior Publication Data
US 2023/0100577 A1 Mar. 30, 2023

(51) Int. Cl.
H10K 59/131 (2023.01)
H10K 50/84 (2023.01)
H10K 59/12 (2023.01)
H10K 59/35 (2023.01)
(Continued)

(52) U.S. Cl.
CPC ......... *H10K 59/131* (2023.02); *H10K 50/841* (2023.02); *H10K 59/353* (2023.02); *H10K 59/65* (2023.02); *H10K 71/00* (2023.02); *H10K 59/1201* (2023.02)

(58) Field of Classification Search
None
See application file for complete search history.

(56) References Cited

U.S. PATENT DOCUMENTS

| 11,243,645 B2 * | 2/2022 | Kim ..................... H10K 50/844 |
| 2018/0350883 A1 * | 12/2018 | Lee ........................ G06F 3/0445 |
| 2019/0051859 A1 | 2/2019 | Choi et al. |

(Continued)

FOREIGN PATENT DOCUMENTS

| CN | 114695418 A * | 7/2022 | ......... H01L 25/0753 |
| JP | 2016195000 A * | 11/2016 | ......... H01L 51/5253 |

(Continued)

Primary Examiner — Michael Lebentritt
(74) Attorney, Agent, or Firm — ScienBiziP, P.C.

(57) ABSTRACT

A non-display region is provided within a display region, a through-hole is provided in the non-display region, a plurality of inner protruding portions are provided in the non-display region so as to surround the through-hole, a lower resin layer of each of the inner protruding portions is separated by a plurality of inner slits formed in the resin substrate layer, some of the plurality of display wiring lines are separated by the through-hole, and a first non-display conductive layer at a bottom portion of the inner slit closest to the display region side is provided so as to overlap the display wiring line separated by the through-hole at one end portion on a side of the through-hole and another end portion on a side of the through-hole.

17 Claims, 13 Drawing Sheets

(51) Int. Cl.
*H10K 59/65* (2023.01)
*H10K 71/00* (2023.01)

(56) References Cited

U.S. PATENT DOCUMENTS

2021/0202655 A1\* 7/2021 Cho .................. H10K 59/1315
2022/0199750 A1\* 6/2022 Cho ..................... G09G 3/3241

FOREIGN PATENT DOCUMENTS

| JP | 2019035950 A | 3/2019 | | |
|---|---|---|---|---|
| WO | WO-2021153156 A1 | * | 8/2021 | ............. G02B 6/009 |
| WO | WO-2021161465 A1 | * | 8/2021 | ......... H01L 27/3258 |
| WO | WO-2022208742 A1 | * | 10/2022 | ............. H10K 50/00 |

\* cited by examiner

DISPLAY DEVICE AND METHOD FOR MANUFACTURING SAME

TECHNICAL FIELD

The disclosure relates to a display device and a method for manufacturing the same.

BACKGROUND ART

In recent years, a self-luminous type organic electroluminescence (hereinafter also referred to as EL) display device using an organic EL element has attracted attention as a display device that can replace liquid crystal display devices. For this organic EL display device, there has been proposed a structure in which in order to install an electronic component such as a camera, a fingerprint sensor or the like, for example, a non-display region having an island shape is provided inside a display region in which an image is displayed and a through-hole penetrating in a thickness direction is provided in the non-display region.

For example, PTL 1 discloses an electronic device including a display panel in which a module hole penetrating through a front face and a back face of a base substrate is provided in a display region, and an electronic module housed in the module hole.

CITATION LIST

Patent Literature

PTL 1: JP 2019-35950 A

SUMMARY

Technical Problem

Incidentally, in an organic EL display device provided with an island-shaped non-display region inside a display region and a through-hole in the non-display region, as described above, some of a plurality of display wiring lines extending parallel to each other in the display region are separated by the through-hole. Thus, it is necessary to input display signals from the periphery of the display region to one side and another side of the separated display wiring line, respectively. However, when a disconnection occurs in each of the separated display wiring lines, a display signal is not supplied to a downstream side (through-hole side) from the disconnected point, resulting in a significant deterioration of display quality.

The disclosure has been made in view of this point, and ensures display quality by enabling the correction of a defect due to a disconnection of a display wiring line separated by a through-hole provided inside a display region.

Solution to Problem

In order to achieve the above-described purpose, a display device according to the disclosure includes a resin substrate layer, a thin film transistor layer provided on the resin substrate layer and including a lower inorganic insulating film, a lower wiring line layer, and an organic insulating film layered in order, and a light-emitting element layer provided on the thin film transistor layer, and including a plurality of first electrodes, a plurality of light-emitting function layers, and a common second electrode layered in order corresponding to a plurality of subpixels constituting a display region, in which a non-display region with an island shape is provided inside the display region, a through-hole passing through the resin substrate layer in the non-display region in a thickness direction is provided, an electronic component is installed in the through-hole, in the non-display region, a plurality of inner protruding portions each are provided to surround the through-hole, each of the plurality of inner protruding portions includes a lower resin layer constituted by the resin substrate layer and a lower inorganic insulating layer provided on the lower resin layer and formed in the same layer with the same material as the lower inorganic insulating film, the lower resin layer of each of the plurality of the inner protruding portions is separated by a plurality of inner slits each formed on a surface of the resin substrate layer on a side of the lower inorganic insulating film, the lower inorganic insulating layer is provided to protrude from the lower resin layer in an eaves shape to at least one of a side of the through-hole and a side of the display region, in the display region, a plurality of display wiring lines are provided to extend in parallel to each other as the lower wiring line layer, some of the plurality of display wiring lines are separated by the through-hole, at a bottom portion of each of the plurality of inner slits, a first non-display conductive layer is formed in the same layer with the same material as the second electrode, and the first non-display conductive layer closest to the display region is provided to overlap each of the some of the plurality of display wiring lines separated by the through-hole at one end portion on a side of the through-hole and another end portion on a side of the through-hole.

A method for manufacturing a display device according to the disclosure includes forming a thin film transistor layer including a lower inorganic insulating film, a lower wiring line layer, and an organic insulating film layered in order on a resin substrate layer, on the thin film transistor layer, forming a light-emitting element layer including a plurality of first electrodes, a plurality of light-emitting function layers, and a common second electrode layered in order corresponding to a plurality of subpixels constituting a display region, and forming a through-hole passing through the resin substrate layer in a thickness direction in a non-display region defined in an island shape inside the display region, in which an electronic component is installed in the through-hole, the forming a thin film transistor layer includes in the display region, forming a plurality of display wiring lines extending parallel to each other as the lower wiring line layer, by patterning the lower inorganic insulating film, in the non-display region, forming a plurality of lower inorganic insulating layers to surround the through-hole formed in the forming a through-hole, and by forming a plurality of inner slits on a surface of the resin substrate layer exposed from the plurality of lower inorganic insulating layers and forming a plurality of lower resin layers by the resin substrate layer, forming a plurality of inner protruding portions in which each of the plurality of lower inorganic insulating layers is layered on each of the plurality of lower resin layers, and each of the plurality of lower inorganic insulating layers protrudes from each of the plurality of lower resin layers in an eaves-like shape to at least one of a side of the through-hole and a side of the display region, and the forming a light-emitting element layer includes when forming the second electrode, forming a first non-display conductive layer formed in the same layer with the same material as the second electrode at a bottom portion of each of the plurality of inner slits and overlapping some of the plurality of display wiring lines separated by the through-hole formed in the forming a through-hole, at one end portion on a side of the through-hole and another end portion on a side of the through-hole, and the method includes, after the forming a through-hole, detecting a disconnection in the some of the plurality of display wiring lines separated by the through-hole, and by irradiating, with laser light, overlapping portions between the first non-display conductive layer and a display wiring line having the disconnection detected, at one end portion on the side of the through-hole and another end portion on the side of the through-hole, performing correcting for electrically connecting the display wiring line and the first non-display conductive layer.

Advantageous Effects of Disclosure

According to the disclosure, at the bottom portion of each inner slit formed in the resin substrate layer, the first non-display conductive layer formed in the same layer with the same material as the second electrode is provided, and the first non-display conductive layer closest to the display region is provided so as to overlap the display wiring line separated by the through-hole at one end portion on the through-hole side and another end portion on the through-hole side. Thus, in the display wiring line separated by the through-hole provided inside the display region, the defect due to the disconnection can be corrected and the display quality can be ensured.

DESCRIPTION OF EMBODIMENTS

Embodiments of the disclosure will be described below in detail with reference to the drawings. Note that the disclosure is not limited to each embodiment to be described below.

First Embodiment

Figure 1:
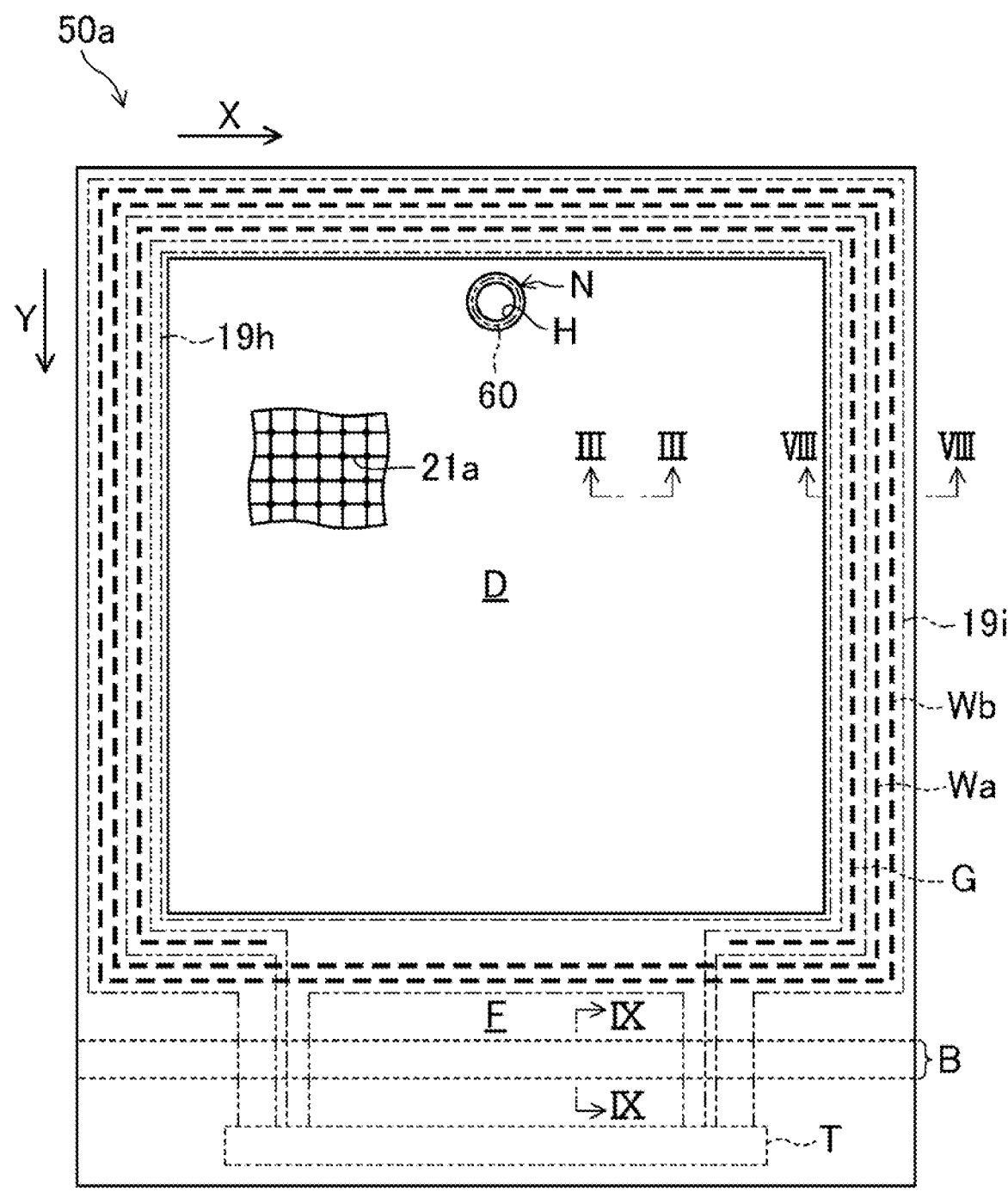
FIG. 1 is a plan view illustrating a schematic configuration of an organic EL display device according to a first embodiment of the disclosure.
Figure 2:
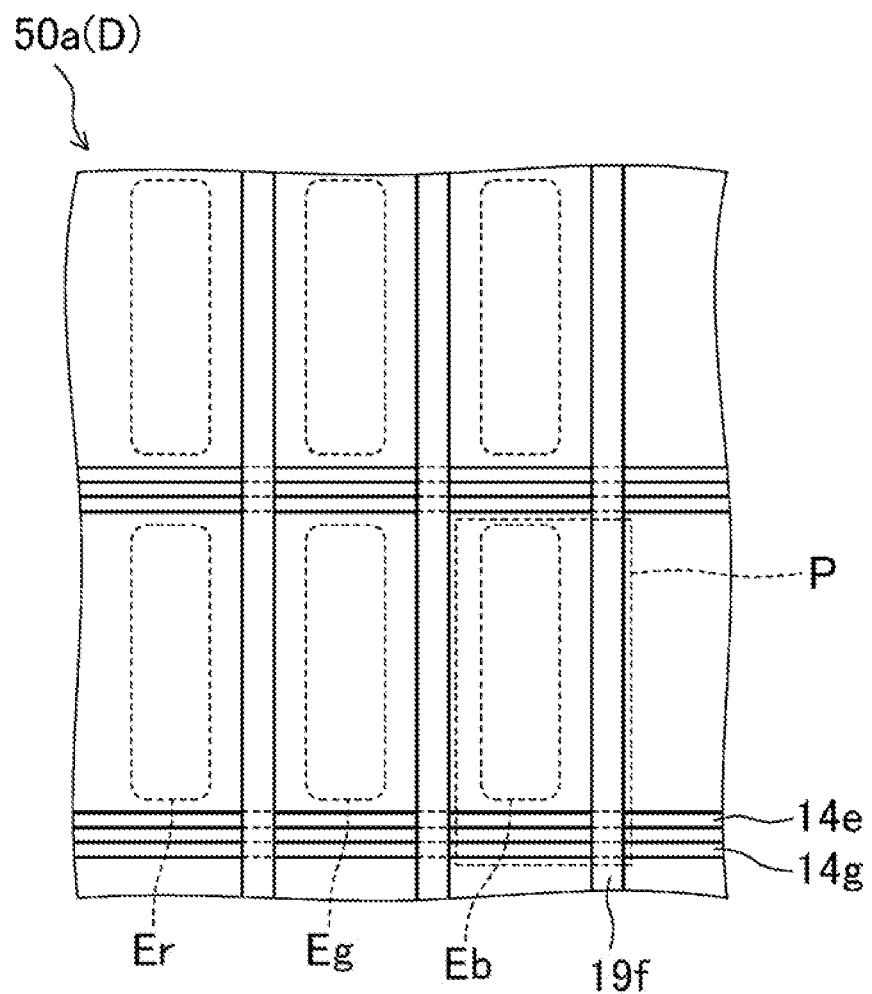
FIG. 2 is a plan view of a display region of the organic EL display device according to the first embodiment of the disclosure.
Figure 3:
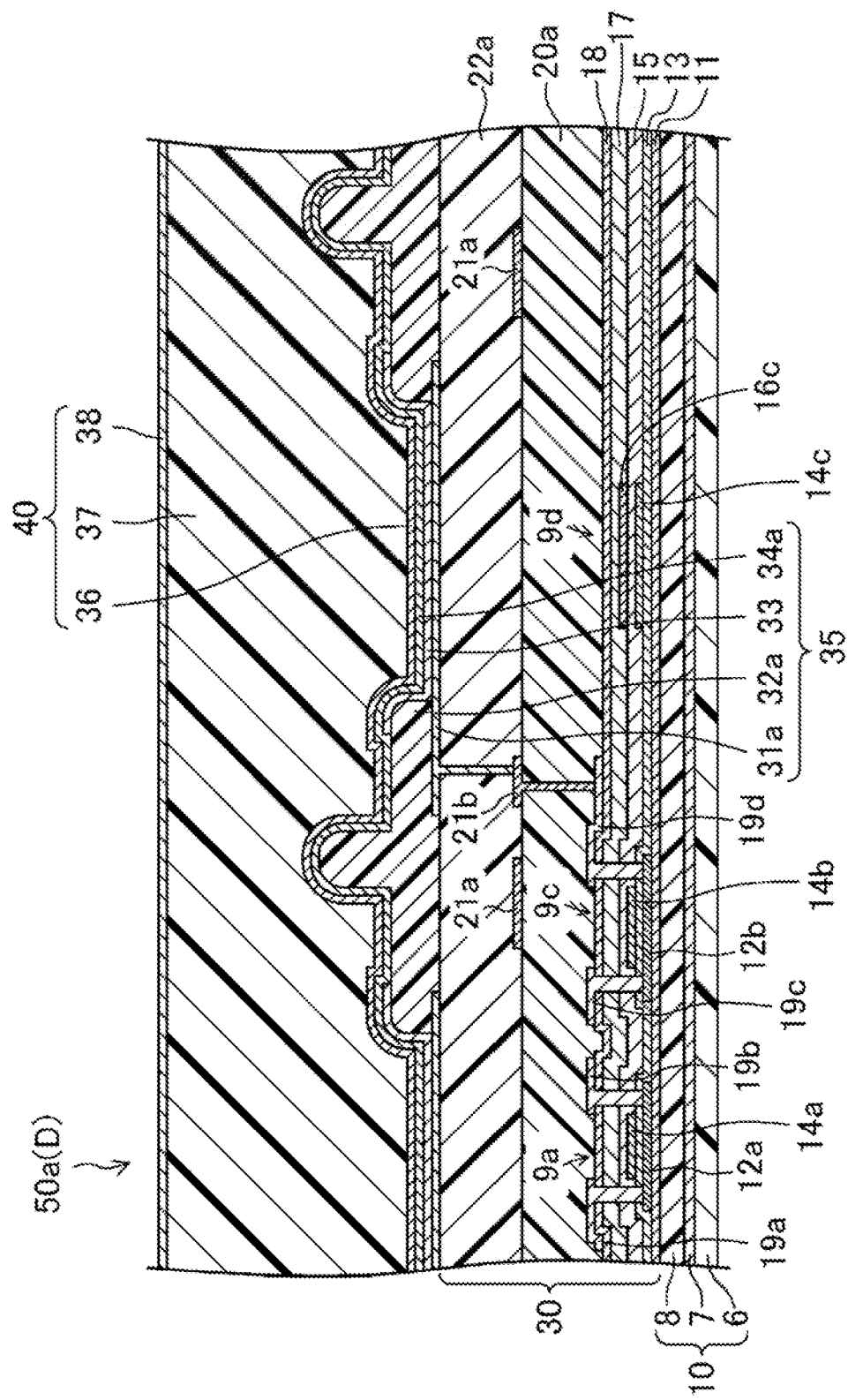
FIG. 3 is a cross-sectional view of the display region of the organic EL display device taken along a line III-III in FIG. 1.
Figure 4:
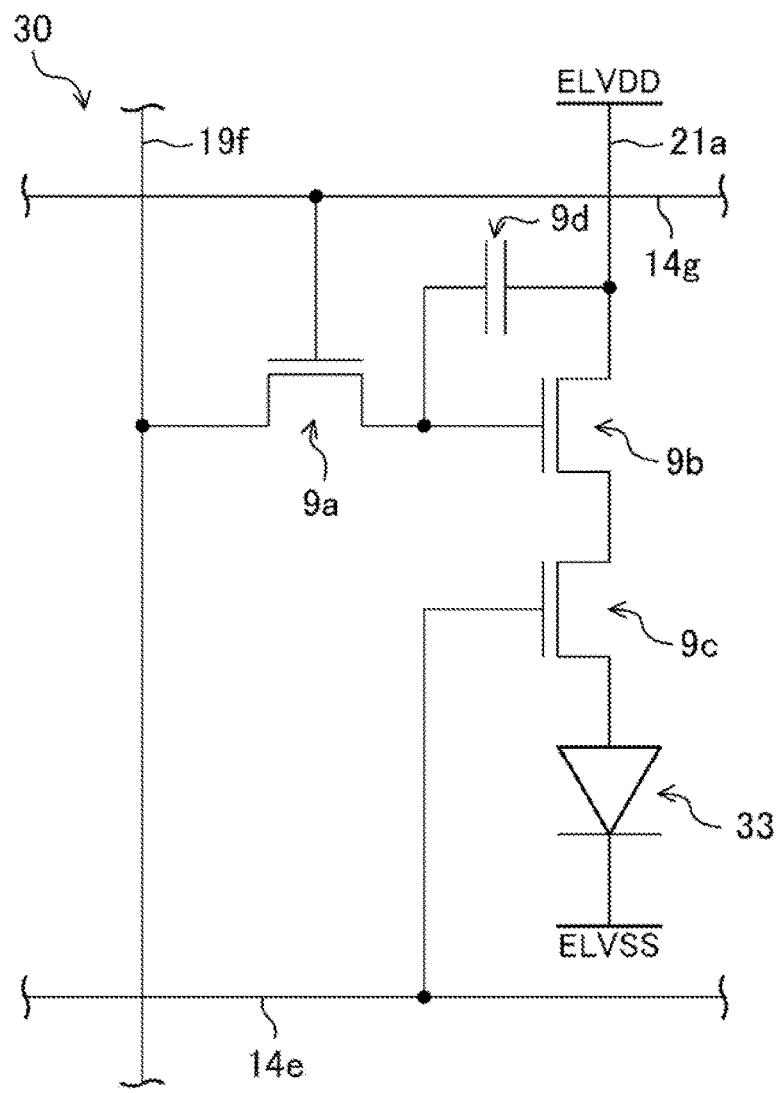
FIG. 4 is an equivalent circuit diagram of a TFT layer constituting the organic EL display device according to the first embodiment of the disclosure.
Figure 5:
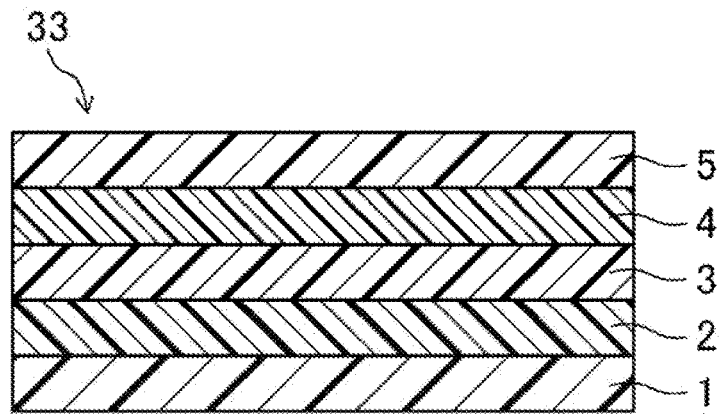
FIG. 5 is a cross-sectional view illustrating an organic EL layer constituting the organic EL display device according to the first embodiment of the disclosure.
Figure 6:
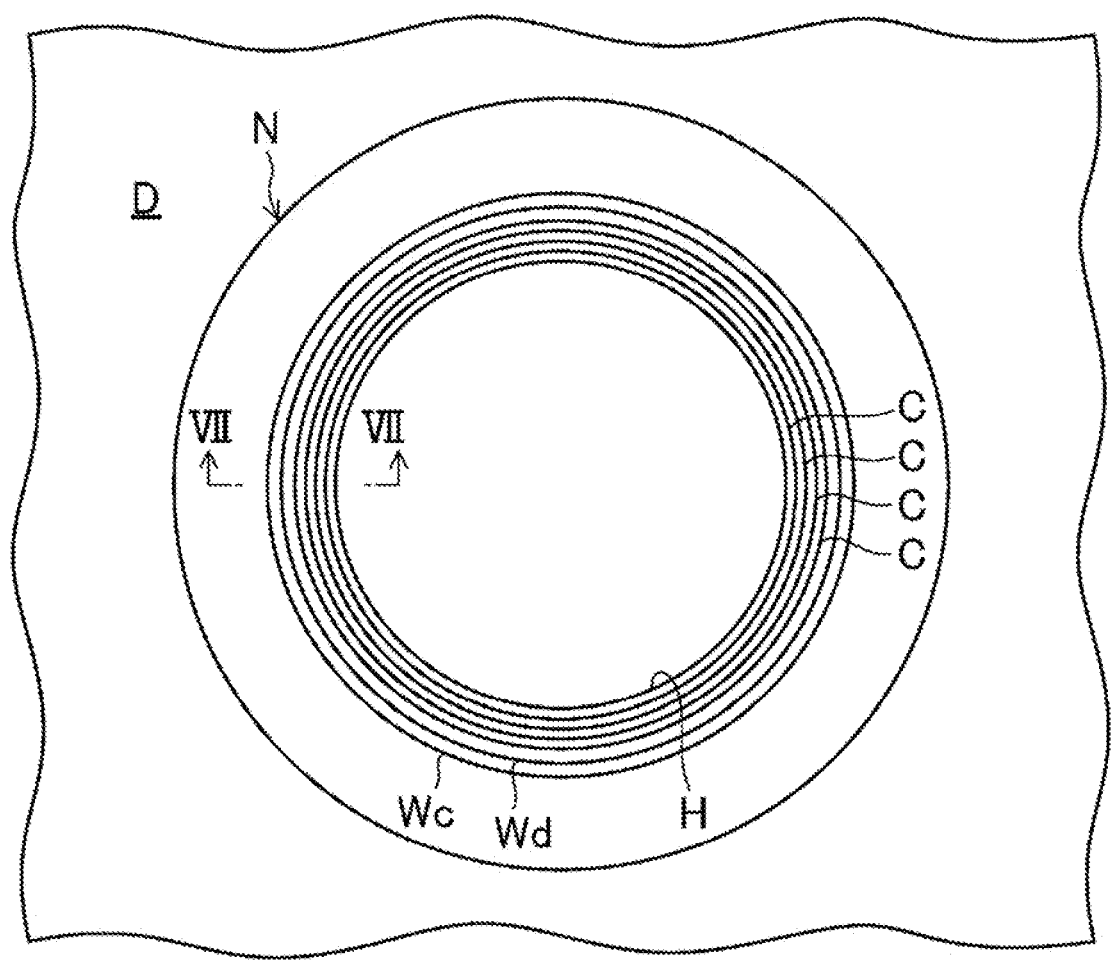
FIG. 6 is a plan view of a non-display region and the periphery of the non-display region of the organic EL display device according to the first embodiment of the disclosure.
Figure 7:
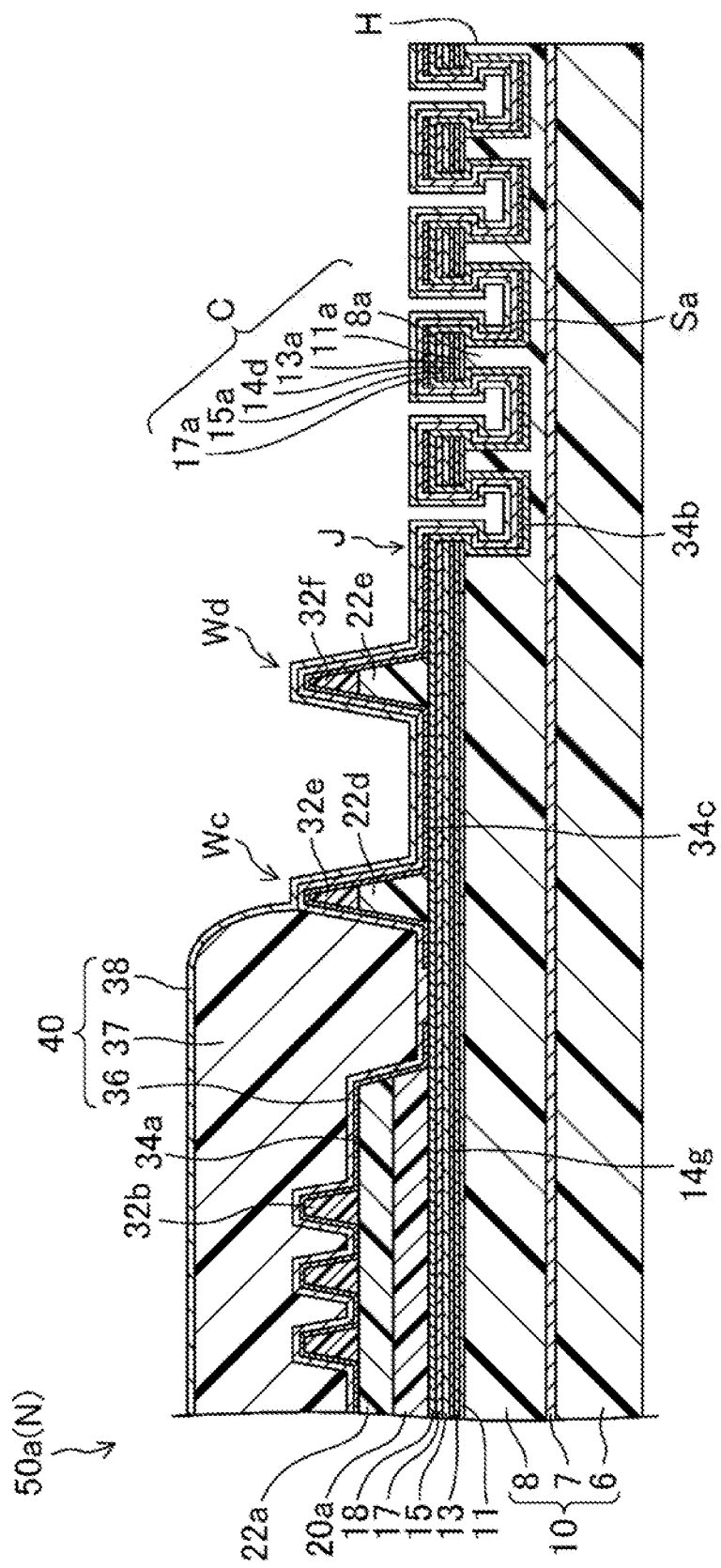
FIG. 7 is a cross-sectional view of the non-display region of the organic EL display device taken along a line VII-VII in FIG. 6.
Figure 8:
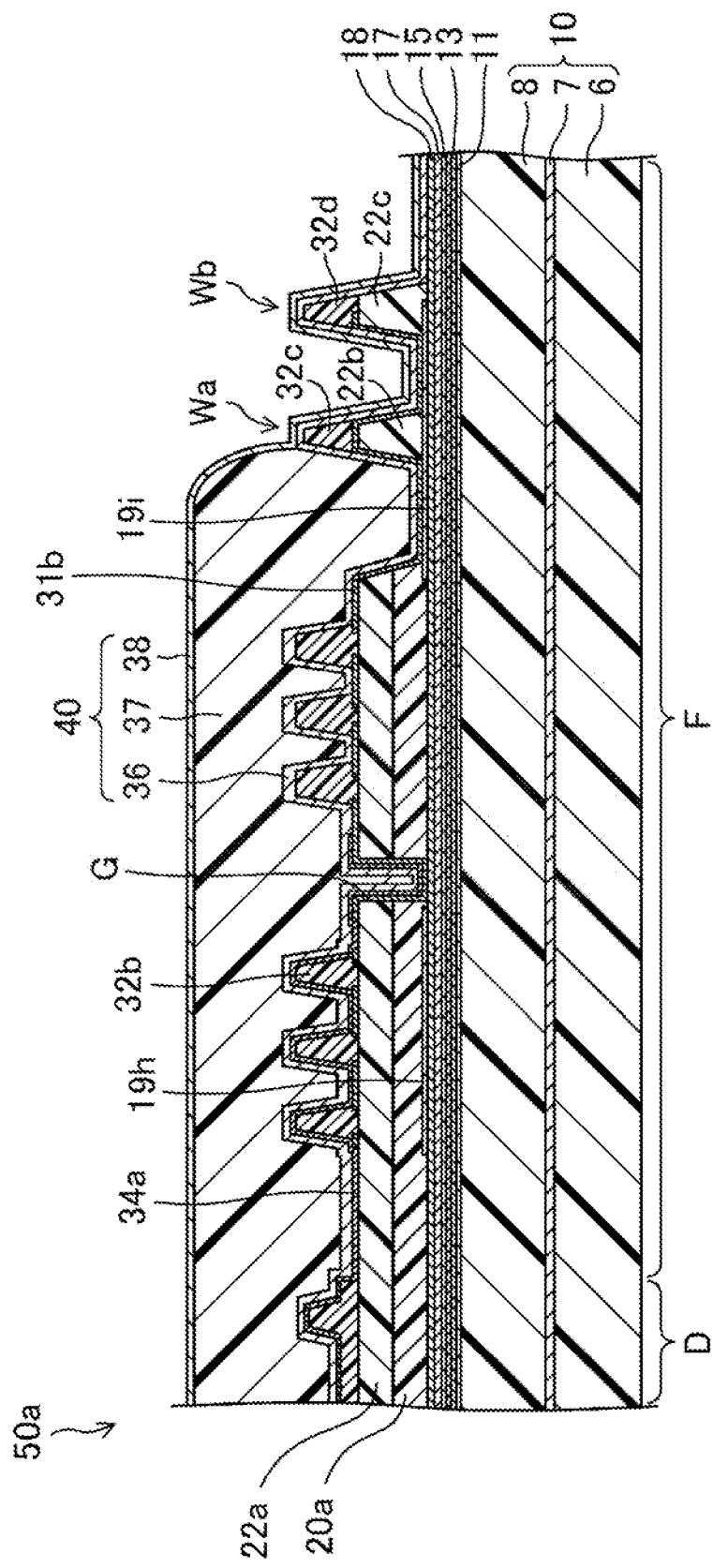
FIG. 8 is a cross-sectional view of the organic EL display device taken along a line VIII-VIII in FIG. 1.
Figure 9:
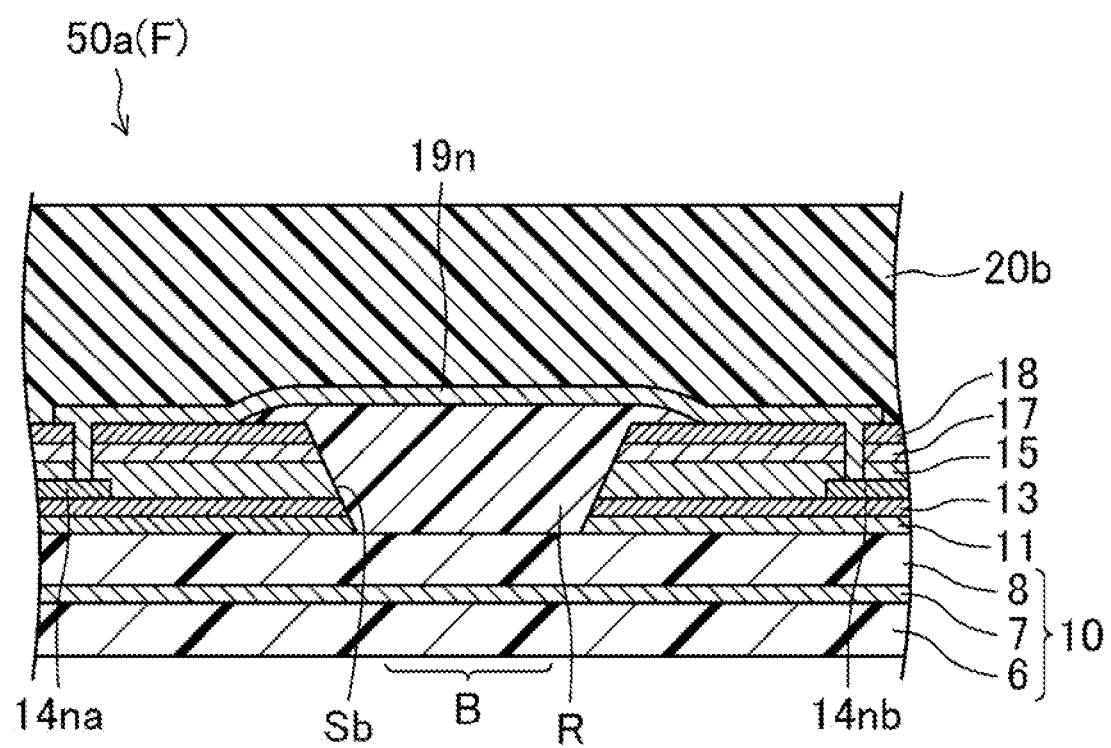
FIG. 9 is a cross-sectional view of a frame region of the organic EL display device taken along a line IX-IX in FIG. 1.

FIG. 1 to FIG. 13 illustrate a first embodiment of a display device and a method for manufacturing the display device according to the disclosure. Note that, in each of the following embodiments, an organic EL display device including an organic EL element layer is exemplified as a display device including a light-emitting element layer. Here, FIG. 1 is a plan view illustrating a schematic configuration of an organic EL display device 50a according to the present embodiment. Further, FIG. 2 is a plan view of a display region D of the organic EL display device 50a. Additionally, FIG. 3 is a cross-sectional view of the display region D of the organic EL display device 50a taken along a line III-III in FIG. 1. Additionally, FIG. 4 is an equivalent circuit diagram of a thin film transistor (TFT) layer 30 constituting the organic EL display device 50a. Additionally, FIG. 5 is a cross-sectional view illustrating an organic EL layer 33 constituting the organic EL display device 50a. Further, FIG. 6 is a plan view of a non-display region N and the periphery of the non-display region N of the organic EL display device 50a. Further, FIG. 7 is a cross-sectional view of the non-display region N of the organic EL display device 50a taken along a line VII-VII in FIG. 6. FIG. 8 is a cross-sectional view of the organic EL display device 50a taken along a line VIII-VIII in FIG. 1. Further, FIG. 9 is a cross-sectional view of a frame region F of the organic EL display device 50a taken along a line IX-IX in FIG. 1.

As illustrated in FIG. 1, the organic EL display device 50a includes, for example, the display region D provided in a rectangular shape for displaying an image, and the frame region F provided in a frame-like shape around the display region D. Note that in the present embodiment, the display region D having the rectangular shape has been exemplified, but examples of the rectangular shape include a substantially rectangular shape such as a shape whose sides are arc-shaped, a shape whose corners are arc-shaped, a shape in which a part of a side has a notch and the like.

As illustrated in FIG. 2, a plurality of subpixels P are arranged in a matrix shape in the display region D. In addition, in the display region D, for example, a subpixel P including a red light-emitting region Er configured to display a red color, a subpixel P including a green light-emitting region Eg configured to display a green color, and a subpixel P including a blue light-emitting region Eb configured to display a blue color are provided adjacent to one another, as illustrated in FIG. 2. Note that one pixel is configured by, for example, the three adjacent subpixels P including the red light-emitting region Er, the green light-emitting region Eg, and the blue light-emitting region Eb in the display region D. Further, as illustrated in FIG. 1, the non-display region N is provided in an island shape inside the display region D. Here, as illustrated in FIG. 1, in the non-display region N, a through-hole H that passes through a resin substrate layer 10 to be described below in a thickness direction is provided in order to install an electronic component 60, such as a camera, a fingerprint sensor, a face recognition sensor or the like on a back face side.

A terminal portion T is provided at a lower end portion of the frame region F in FIG. 1 in such a manner as to extend in one direction (X-direction in the drawing). Additionally, as illustrated in FIG. 1, in the frame region F, a bending portion B bendable, for example, by 180 degrees (in a U-shape) about a bending axis that is the X-direction in the drawing is provided between the display region D and the terminal portion T, and extends in one direction (X-direction in the drawing). In addition, as illustrated in FIGS. 1 and 8, in the frame region F, a first flattening film 20a and a second flattening film 22a, described below, are provided with a trench G having a substantially C shape in a plan view and passing through the first flattening film 20a and the second flattening film 22a. Here, as illustrated in FIG. 1, in a plan view, the trench G is provided in a substantially C shape and open on a terminal portion T side.

As illustrated in FIG. 3, the organic EL display device 50a includes a resin substrate layer 10, a TFT layer 30 provided on the resin substrate layer 10, an organic EL element layer 35 provided as a light-emitting element layer on the TFT layer 30, and a sealing film 40 provided in such a manner as to cover the organic EL element layer 35.

As illustrated in FIGS. 3, 7, 8, and 9, the resin substrate layer 10 includes a first resin substrate layer 6 provided on an opposite side to the TFT layer 30, a second resin substrate layer 8 provided on a side of the TFT layer 30, and an in-substrate inorganic insulating film 7 provided between the first resin substrate layer 6 and the second resin substrate layer 8. Each of the first resin substrate layer 6 and the second resin substrate layer 8 is made of, for example, a polyimide resin or the like. Each of the in-substrate inorganic insulating film 7, and a base coat film 11, a gate insulating film 13, a first interlayer insulating film 15, a second interlayer insulating film 17, and a third interlayer insulating film 18, which are described later, is made of a single-layer film or a layered film of an inorganic insulating film such as silicon nitride, silicon oxide, silicon oxynitride or the like. In the non-display region N, on a surface of the second resin substrate layer 8 on the side of the TFT layer 30, as illustrated in FIG. 7, a plurality of inner slits Sa concentrically and annularly provided so as to surround the through-hole H.

As illustrated in FIG. 3, the TFT layer 30 includes the base coat film 11 provided on the resin substrate layer 10, and a plurality of first TFTs 9a, a plurality of second TFTs 9b (see FIG. 4), a plurality of third TFTs 9c, and a plurality of capacitors 9d provided on the base coat film 11, and the first flattening film 20a and the second flattening film 22a sequentially provided on each of first TFTs 9a, each of second TFTs 9b, each of third TFTs 9c, and each of capacitors 9d.

In the TFT layer 30, as illustrated in FIG. 3, on the resin substrate layer 10, the base coat film (lower inorganic insulating film) 11, a semiconductor film such as a semiconductor layer 12a described later, the gate insulating film (lower inorganic insulating film) 13, a first wiring line layer (lower wiring line layer) such as a gate line 14g described later, the first interlayer insulating film 15, a second wiring line layer such as an upper conductive layer 16c described later, the second interlayer insulating film 17, the third interlayer insulating film 18, a third wiring line layer such as a source line 19f described later, the first flattening film (organic insulating film) 20a, a fourth wiring line layer such as a power source line 21a, and the second flattening film (organic insulating film) 22a are layered in order.

As illustrated in FIGS. 2 and 4, in the TFT layer 30, a plurality of gate lines 14g are provided as the first wiring line layer so as to extend parallel to each other in a lateral direction in the drawings. In addition, in the TFT layer 30, as illustrated in FIGS. 2 and 4, a plurality of light emission control lines 14e are provided as the first wiring line layer so as to extend parallel to each other in the lateral direction in the drawings. Note that, as illustrated in FIG. 2, each of the light emission control lines 14e is provided adjacent to each of the gate lines 14g. Further, as illustrated in FIG. 7, some of the plurality of gate lines 14g are separated in the non display region N by the through-hole H formed in the non-display region N (see FIG. 11 described below). In the TFT layer 30, as illustrated in FIGS. 2 and 4, a plurality of source lines 19f are provided as the third wiring line layer in such a manner as to extend parallel to each other in a longitudinal direction in the drawings. In the TFT layer 30, the power source line 21a is provided in a lattice pattern (see FIG. 1) as the fourth wiring line layer between the first flattening film 20a and the second flattening film 22a. In addition, in the TFT layer 30, as illustrated in FIG. 4, each subpixel P includes the first TFT 9a, the second TFT 9b, the third TFT 9c, and the capacitor 9d.

As illustrated in FIG. 4, the first TFT 9a is electrically connected to the corresponding gate line 14g, the corresponding source line 19f, and the corresponding second TFT 9b in each subpixel P. Additionally, as illustrated in FIG. 3, the first TFT 9a includes the semiconductor layer 12a, the gate insulating film 13, a gate electrode 14a, the first interlayer insulating film 15, the second interlayer insulating film 17, the third interlayer insulating film 18, and a source electrode 19a and a drain electrode 19b, which are provided in this order on the base coat film 11. Here, as illustrated in FIG. 3, the semiconductor layer 12a is provided in an island shape on the base coat film 11, and includes a channel region, a source region, and a drain region, as described below. Additionally, as illustrated in FIG. 3, the gate insulating film 13 is provided so as to cover the semiconductor layer 12a. Additionally, as illustrated in FIG. 3, the gate electrode 14a is provided on the gate insulating film 13 such that the gate electrode 14a overlaps with the channel region of the semiconductor layer 12a. Additionally, as illustrated in FIG. 3, the first interlayer insulating film 15, the second interlayer insulating film 17 and the third interlayer insulating film 18 are sequentially provided so as to cover the gate electrode 14a. Additionally, as illustrated in FIG. 3, the source electrode 19a and the drain electrode 19b are separated from each other on the third interlayer insulating film 18. Further, as illustrated in FIG. 3, the source electrode 19a and the drain electrode 19b are electrically connected to the source region and the drain region of the semiconductor layer 12a, respectively, via respective contact holes formed in a layered film configured by the gate insulating film 13, the first interlayer insulating film 15, the second interlayer insulating film 17, and the third interlayer insulating film 18.

As illustrated in FIG. 4, the second TFT 9b is electrically connected to the corresponding first TFT 9a, the corresponding power source line 21a, and the corresponding third TFT 9c in each subpixel P. Note that the second TFT 9b has substantially the same structure as the first TFT 9a and the third TFT 9c to be described later.

As illustrated in FIG. 4, the third TFT 9c is electrically connected to the corresponding second TFT 9b, the corresponding organic EL layer 33 (a first electrode 31a in contact with the organic EL layer 33) described later, and the corresponding light emission control line 14e in each subpixel P. Additionally, as illustrated in FIG. 3, the third TFT 9c includes a semiconductor layer 12b, the gate insulating film 13, a gate electrode 14b, the first interlayer insulating film 15, the second interlayer insulating film 17, the third interlayer insulating film 18, and a source electrode 19c and a drain electrode 19d that are sequentially provided on the base coat film 11. Here, as illustrated in FIG. 3, the semiconductor layer 12b is provided in an island shape on the base coat film 11, and includes a channel region, a source region, and a drain region, as with the semiconductor layer 12a. Additionally, as illustrated in FIG. 3, the gate insulating film 13 is provided to cover the semiconductor layer 12b. Additionally, as illustrated in FIG. 3, the gate electrode 14b is provided on the gate insulating film 13 such that the gate electrode 14b overlaps with the channel region of the semiconductor layer 12b. Additionally, as illustrated in FIG. 3, the first interlayer insulating film 15, the second interlayer insulating film 17, and the third interlayer insulating film 18 are provided in this order to cover the gate electrode 14b. Additionally, as illustrated in FIG. 3, the source electrode 19c and the drain electrode 19d are separated from each other on the third interlayer insulating film 18. Further, as illustrated in FIG. 3, the source electrode 19c and the drain electrode 19d are electrically connected to the source region and the drain region of the semiconductor layer 12b, respectively, via respective contact holes formed in the layered film configured by the gate insulating film 13, the first interlayer insulating film 15, the second interlayer insulating film 17, and the third interlayer insulating film 18.

Note that, in the present embodiment, the first TFT 9a, the second TFT 9b, and the third TFT 9c of a top gate type are exemplified, but the first TFT 9a, the second TFT 9b, and the third TFT 9c may be of a bottom gate type.

As illustrated in FIG. 4, the capacitor 9d is electrically connected to the corresponding first TFT 9a and the corresponding power source line 21a in each subpixel P. Here, the capacitor 9d includes, as illustrated in FIG. 3, a lower conductive layer 14c provided as the first wiring line layer, the first interlayer insulating film 15 provided so as to cover the lower conductive layer 14c, and the upper conductive layer 16c provided, as the second wiring line layer, on the first interlayer insulating film 15 so as to overlap with the lower conductive layer 14c. Note that the upper conductive layer 16c is electrically connected to the power source line 21a via a contact hole (not illustrated) formed in the second interlayer insulating film 17, the third interlayer insulating film 18, and the first flattening film 20a.

Each of the first flattening film 20a and the second flattening film 22a has a flat surface in the display region D, and is made of, for example, an organic resin material such as a polyimide resin, an acrylic resin, a polysiloxane resin or the like. Here, as illustrated in FIG. 3, between the first flattening film 20a and the second flattening film 22a, a relay electrode 21b is provided as the fourth wiring line layer in addition to the power source line 21a described above.

The organic EL element layer 35 includes, as illustrated in FIG. 3, a plurality of first electrodes 31a, an edge cover 32a, a plurality of organic EL layers 33, and a second electrode 34a that are provided sequentially on the TFT layer 30.

The plurality of first electrodes 31a are provided in a matrix shape on the second flattening film 22a so as to correspond to the plurality of subpixels P as illustrated in FIG. 3. As illustrated in FIG. 3, the first electrode 31a is electrically connected to the drain electrode 19d of each third TFT 9c via a contact hole formed in the first flattening film 20a, the relay electrode 21b, and a contact hole formed in the second flattening film 22a. Additionally, the first electrode 31a has a function to inject a hole (positive hole) into each of the organic EL layers 33. Additionally, the first electrode 31a is preferably formed of a material having a large work function to improve hole injection efficiency into the organic EL layer 33. Here, examples of a material constituting the first electrode 31a include a metallic material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), tin (Sn) and the like. Examples of the material of the first electrode 31a also include an alloy such as astatine (At)/astatine oxide ($AtO_2$). Further, the material constituting the first electrode 31a may be, for example, an electrically conductive oxide such as tin oxide (SnO), zinc oxide (ZnO), indium tin oxide (ITO), indium zinc oxide (IZO) and the like. Additionally, the first electrode 31a may be formed by layering a plurality of layers including any of the materials described above. Note that, examples of compound materials having a high work function include indium tin oxide (ITO), indium zinc oxide (IZO) and the like.

As illustrated in FIG. 3, the edge cover 32a is provided in a lattice pattern, and covers a peripheral end portion of each of the first electrodes 31a. Here, examples of a material of the edge cover 32a include organic resin materials such as a polyimide resin, an acrylic resin, a polysiloxane resin and the like.

As illustrated in FIG. 3, the plurality of organic EL layers 33 are disposed on the first electrodes 31a, respectively, and are provided in a matrix shape, as light-emitting function layers, in such a manner as to correspond to the plurality of subpixels P. Here, as illustrated in FIG. 5, each of the organic EL layers 33 includes a hole injection layer 1, a hole transport layer 2, a light-emitting layer 3, an electron transport layer 4, and an electron injection layer 5 that are provided sequentially on the first electrode 31a.

The hole injection layer 1 is also referred to as an anode electrode buffer layer, and has a function to reduce an energy level difference between the first electrode 31a and the organic EL layer 33 and to improve hole injection efficiency from the first electrode 31a into the organic EL layer 33. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like.

The hole transport layer 2 has a function to improve hole transport efficiency from the first electrode 31a to the organic EL layer 33. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

The light-emitting layer 3 is a region where holes and electrons are injected from the first electrode 31*a* and the second electrode 34*a*, respectively, and the holes and the electrons recombine, in a case where a voltage is applied via the first electrode 31*a* and the second electrode 34*a*. Here, the light-emitting layer 3 is formed of a material having high luminous efficiency. Moreover, examples of materials constituting the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 has a function of facilitating migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds, and the like, as organic compounds.

The electron injection layer 5 has a function of reducing an energy level difference between the second electrode 34*a* and the organic EL layer 33 and improve the efficiency of electron injection into the organic EL layer 33 from the second electrode 34*a*. With this function, the drive voltage of the organic EL element can be reduced. Note that the electron injection layer 5 is also referred to as a cathode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), barium fluoride ($BaF_2$) and the like, aluminum oxide ($Al_2O_3$), strontium oxide (SrO), and the like.

The second electrode 34*a* is provided on the plurality of organic EL layers 33 so as to be common to the plurality of subpixels P, that is, the second electrode 34*a* is provided to cover each of organic EL layers 33 and the edge cover 32*a*, as illustrated in FIG. 3. Further, the second electrode 34*a* functions to inject electrons into the organic EL layer 33. Further, the second electrode 34*a* is preferably formed of a material having a small work function to improve the efficiency of electron injection into the organic EL layer 33. Here, examples of a material constituting the second electrode 34*a* include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). The second electrode 34*a* may also be formed of an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), lithium fluoride (LiF)/calcium (Ca)/aluminum (Al) or the like, for example. In addition, the second electrode 34*a* may be formed of electrically conductive oxide, for example, tin oxide (SnO), zinc oxide (ZnO), indium tin oxide (ITO), indium zinc oxide (IZO), or the like. Further, the second electrode 34*a* may be formed by layering a plurality of layers formed of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

As illustrated in FIG. 3, the sealing film 40 is provided covering the second electrode 34*a*, and includes a first inorganic sealing film 36, an organic sealing film 37, and a second inorganic sealing film 38 sequentially layered on the second electrode 34*a*, and has a function to protect the organic EL layer 33 of the organic EL element layer 35 from moisture and oxygen. Here, each of the first inorganic sealing film 36 and the second inorganic sealing film 38 is made of, for example, an inorganic insulating film such as a silicon nitride film, a silicon oxide film, a silicon oxynitride film or the like. Additionally, the organic sealing film 37 is made of, for example, an organic resin material such as an acrylic resin, an epoxy resin, a silicone resin, a polyurea resin, a parylene resin, a polyimide resin, a polyamide resin or the like.

As illustrated in FIG. 6, the organic EL display device 50*a* includes a plurality of inner protruding portions C each provided concentrically and annularly so as to surround the through-hole H in the non-display region N inside the display region D.

As illustrated in FIG. 7, each inner protruding portion C includes a lower resin layer 8*a* made of the second resin substrate layer 8 of the resin substrate layer 10 and a first lower inorganic insulating layer 11*a*, a second lower inorganic insulating layer 13*a*, a gate conductive layer 14*d*, a first upper inorganic insulating layer 15*a*, and a second upper inorganic insulating layer 17*a* provided in sequence on the lower resin layer 8*a*.

As illustrated in FIG. 7, the lower resin layer 8*a* is separated by a plurality of inner slits Sa each formed concentrically and annularly on the surface of the second resin substrate layer 8 on the side of the base coat film 11 so as to surround the through-hole H. Here, as illustrated in FIG. 7, a first non-display conductive layer 34*b* formed in the same layer with the same material as the second electrode 34*a* is provided annularly on a bottom portion of each inner slit Sa.

The first lower inorganic insulating layer 11*a*, the second lower inorganic insulating layer 13*a*, the gate conductive layer 14*d*, the first upper inorganic insulating layer 15*a*, and the second upper inorganic insulating layer 17*a* are formed in the same layers with the same materials as the base coat film 11, the gate insulating film 13, the gate electrode 14*a*, the first interlayer insulating film 15, and the second interlayer insulating film 17, respectively. Further, as illustrated in FIG. 7, the first lower inorganic insulating layer 11*a*, the second lower inorganic insulating layer 13*a*, the gate conductive layer 14*d*, the first upper inorganic insulating layer 15*a*, and the second upper inorganic insulating layer 17*a* of each inner protruding portion C are provided so as to protrude from the lower resin layer 8*a* of each inner protruding portion C to the through-hole H side and the display region D side in an eaves shape. Note that the configuration is exemplified in which the first lower inorganic insulating layer 11*a*, the second lower inorganic insulating layer 13*a*, the gate conductive layer 14*d*, the first upper inorganic insulating layer 15a, and the second upper inorganic insulating layer 17a protrude from the lower resin layer 8a in an eaves shape to both the through-hole H side and the display region D side. However, the first lower inorganic insulating layer 11a, the second lower inorganic insulating layer 13a, the gate conductive layer 14d, the first upper inorganic insulating layer 15a, and the second upper inorganic insulating layer 17a may protrude from the lower resin layer 8a in an eaves shape to either the through-hole H side or the display region D side. According to this configuration, since each inner protruding portion C has a reverse taper structure in the non-display region N, the common second electrode 34a is formed separately from the first non-display conductive layer 34b at the bottom portion of each inner slit Sa by a step by the eaves-shaped reverse tapered structure. Note that, in the structural example illustrated in FIG. 7, a second non-display conductive layer 34c, which is configured in the same layer with the same material as the second electrode 34a, is annularly provided between the second electrode 34a and the first non-display conductive layer 34b by additionally applying patterning by photolithography, dry etching, or the like. As illustrated in FIG. 7, the first non-display conductive layer 34b closest to the display region D (and the second non-display conductive layer 34c) is provided so as to overlap the gate line 14g separated by the through-hole H at one end portion on a through-hole H side and another end portion on a through-hole H side (see FIG. 11).

Further, among the plurality of inner slits Sa, the inner slit Sa closest to a first inner dam wall We (the display region D side), which will be described later, is provided with an eaves portion J in which the base coat film 11, the gate insulating film 13, the gate line 14g, the first interlayer insulating film 15, and the second interlayer insulating film 17 protrude from the display region D side to the through-hole H side, as illustrated in FIG. 7. Here, as illustrated in FIG. 7, the eaves portion J in which the base coat film 11, the gate insulating film 13, the gate line 14g, the first interlayer insulating film 15, and the second interlayer insulating film 17 are layered is in contact with the first inorganic sealing film 36 with the third interlayer insulating film 18 interposed therebetween. As illustrated in FIG. 7, the lower resin layer 8a is in contact with the first inorganic sealing film 36 with the third interlayer insulating film 18 interposed therebetween. These can ensure sealing performance by the sealing film 40 in the non-display region N in which the through-hole H is formed.

In addition, as illustrated in FIGS. 6 and 7, the organic EL display device 50a includes, in the non-display region N, the first inner dam wall We provided annularly to surround the plurality of inner protruding portions C and a second inner dam wall Wd provided annularly in the periphery of the first inner dam wall Wc.

As illustrated in FIG. 7, the first inner dam wall Wc includes a lower-side resin layer 22d formed in the same layer with the same material as the second flattening film 22a and an upper-side resin layer 32e provided on the lower-side resin layer 22d and formed in the same layer with the same material as the edge cover 32a. Note that the first inner dam wall Wc is provided overlapping an inner peripheral end portion of the organic sealing film 37 of the sealing film 40, and is configured to suppress the spread of ink corresponding to the organic sealing film 37.

As illustrated in FIG. 7, the second inner dam wall Wd includes a lower-side resin layer 22e formed in the same layer with the same material as the second flattening film 22a and an upper-side resin layer 32f provided on the lower-side resin layer 22e and formed in the same layer with the same material as the edge cover 32a.

Additionally, as illustrated in FIG. 1, the organic EL display device 50a includes, in the frame region F, a first outer dam wall Wa provided in a frame-like shape outside the trench G so as to surround the display region D and a second outer dam wall Wb provided in a frame-like shape around the first outer dam wall Wa.

As illustrated in FIG. 8, the first outer dam wall Wa includes a lower-side resin layer 22b formed in the same layer with the same material as the second flattening film 22a and an upper-side resin layer 32c provided on the lower-side resin layer 22b with a connection wiring line 31b interposed therebetween and is formed in the same layer with the same material as the edge cover 32a. Here, the connection wiring line 31b is formed in the same layer with the same material as the first electrode 31a. Note that the first outer dam wall Wa is provided overlapping an outer peripheral end portion of the organic sealing film 37 of the sealing film 40, and is configured to suppress the spread of ink corresponding to the organic sealing film 37.

As illustrated in FIG. 8, the second outer dam wall Wb includes a lower-side resin layer 22c formed in the same layer with the same material as the second flattening film 22a and an upper-side resin layer 32d provided on the lower-side resin layer 22c with the connection wiring line 31b interposed therebetween and is formed in the same layer with the same material as the edge cover 32a.

In addition, as illustrated in FIG. 1, the organic EL display device 50a includes, in the frame region F, a first frame wiring line 19h provided in a frame-like shape as the third wiring line layer inside the trench G, with both end portions extending to the terminal portion T at the opening portion of the trench G. Here, the first frame wiring line 19h is electrically connected to the power source line 21a in the display region D through a contact hole formed in the first flattening film 20a, and is configured so that a high power supply voltage (ELVDD) is input at the terminal portion T.

In addition, as illustrated in FIG. 1, the organic EL display device 50a includes, in the frame region F, a second frame wiring line 19i provided in a substantially C-like shape as the third wiring line layer outside the trench G, with both end portions extending to the terminal portion T. Here, as illustrated in FIG. 8, the second frame wiring line 19i is electrically connected to the second electrode 34a in the display region D via the connection wiring line 31b provided in the trench G, and is configured so that a low power supply voltage (ELVSS) is input at the terminal portion T.

Further, as illustrated in FIG. 8, the organic EL display device 50a includes a plurality of peripheral photo spacers 32b provided in island shapes so as to protrude upward at both edge portions of the trench G in the frame region F. Here, the peripheral photo spacer 32b is formed in the same layer with the same material as the edge cover 32a.

As illustrated in FIG. 9, the organic EL display device 50a includes, at the bending portion B, a filling layer R disposed to fill in a linear slit Sb formed in the base coat film 11, the gate insulating film 13, the first interlayer insulating film 15, the second interlayer insulating film 17, and the third interlayer insulating film 18, a plurality of lead wiring lines 19n disposed as the third wiring line layer on the filling layer R and the third interlayer insulating film 18, and a wiring line covering layer 20b disposed to cover the lead wiring lines 19n.

As illustrated in FIG. 9, the linear slit Sb is provided in a groove shape passing through along a direction in which the bending portion B extends so as to pass through the base coat film 11, the gate insulating film 13, the first interlayer insulating film 15, the second interlayer insulating film 17, and the third interlayer insulating film 18 to expose an upper face of the resin substrate layer 10.

The filling layer R is made of, for example, an organic resin material such as a polyimide resin, an acrylic resin, a polysiloxane resin or the like.

The plurality of lead wiring lines 19n are provided extending parallel to each other in a direction orthogonal to the direction in which the bending portion B extends. Here, as illustrated in FIG. 9, both end portions of each of the lead wiring lines 19n are electrically connected to a first gate conductive layer 14na and a second gate conductive layer 14nb respectively via respective contact holes formed in a layered film of the first interlayer insulating film 15, the second interlayer insulating film 17, and the third interlayer insulating film 18. Note that the first gate conductive layer 14na is provided as the first wiring line layer and is electrically connected to the display wiring line (source line 19f, etc.) disposed in the display region D. Further, the second gate conductive layer 14nb is provided as the first wiring line layer and is electrically connected to the terminal of the terminal portion T. The wiring line covering layer 20b is formed in the same layer with the same material as the first flattening film 20a.

In the organic EL display device 50a described above, in each subpixel P, by inputting a gate signal to the first TFT 9a via the gate line 14g, the first TFT 9a is turned on. When a predetermined voltage corresponding to a source signal is written to the gate electrode of the second TFT 9b and the capacitor 9d via the source line 19f and a light emission control signal is input to the third TFT 9c via the light emission control line 14e, the third TFT 9c turns on. By supplying a current corresponding to the gate voltage of the second TFT 9b from the power source line 21a to the organic EL layer 33, the light-emitting layer 3 of the organic EL layer 33 emits light to display an image. Note that, in the organic EL display device 50a, even when the first TFT 9a becomes an off state, the gate voltage of the second TFT 9b is held by the capacitor 9d, and thus light emission by the light-emitting layer 3 is maintained in each subpixel P until a gate signal of the next frame is input.

Figure 10:
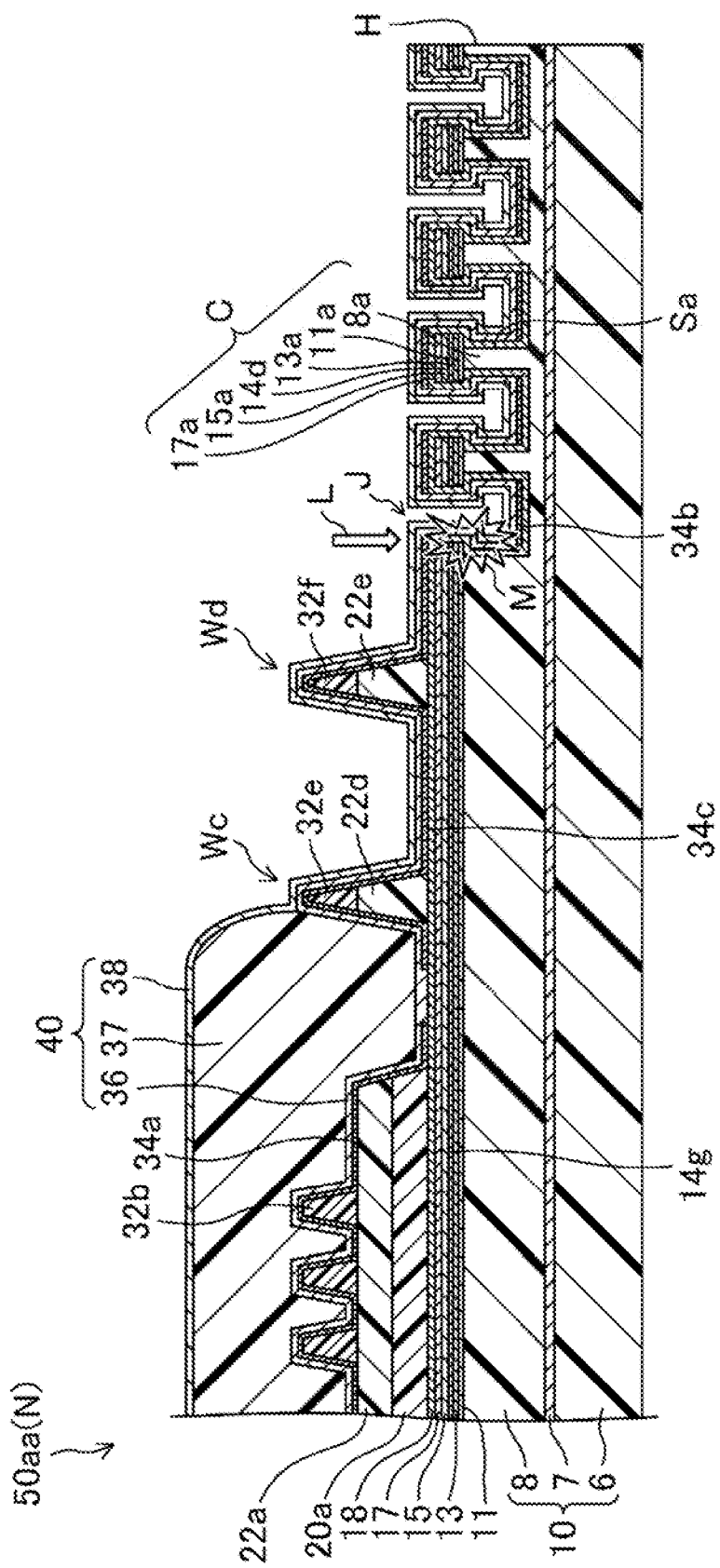
FIG. 10 is a cross-sectional view illustrating a correction step in a method for manufacturing the organic EL display device according to the first embodiment of the disclosure.
Figure 11:
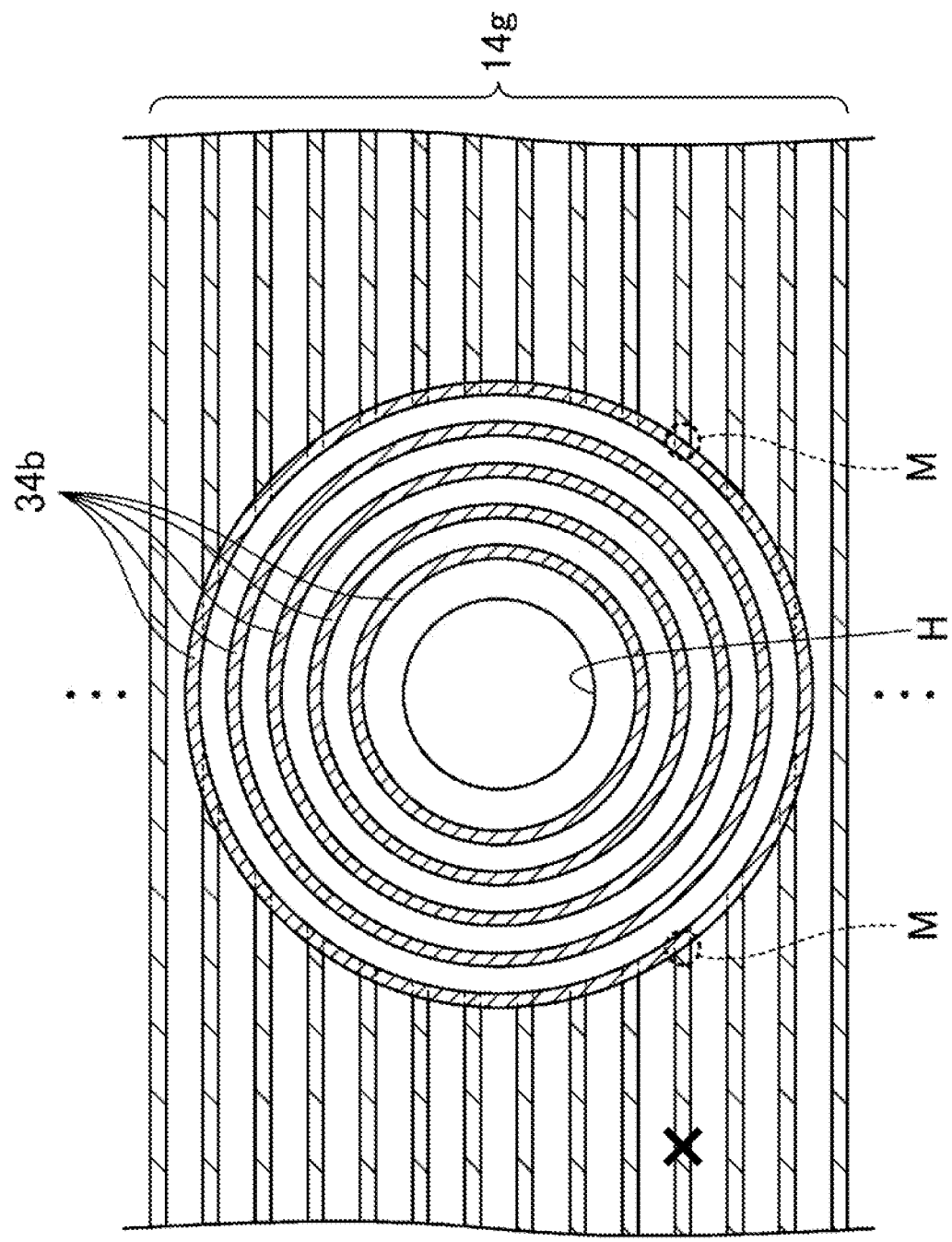
FIG. 11 is a plan view illustrating the correction step in the method for manufacturing the organic EL display device according to the first embodiment of the disclosure.
Figure 12:
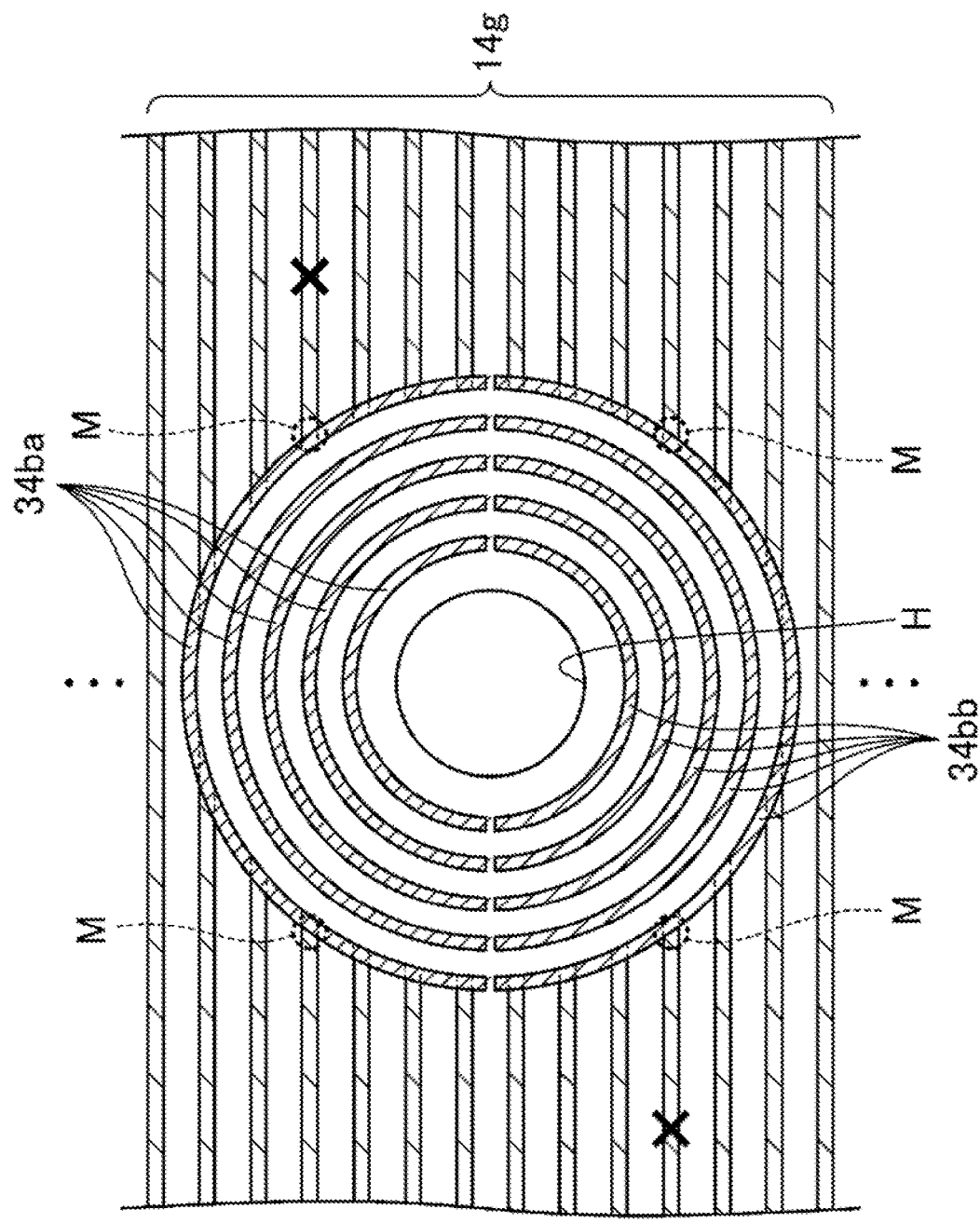
FIG. 12 is a plan view illustrating a correction step in a method for manufacturing of a modified example of the organic EL display device according to the first embodiment of the disclosure.
Figure 13:
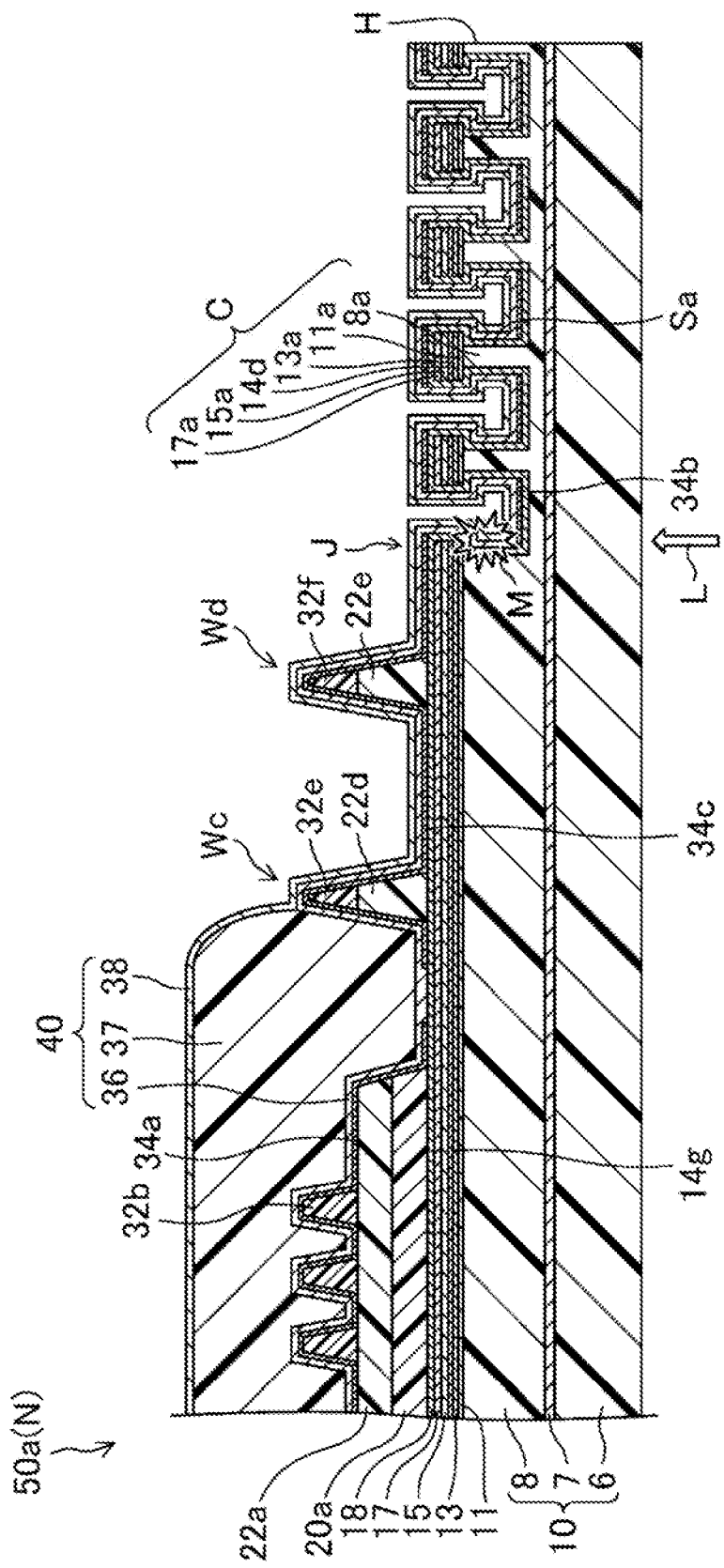
FIG. 13 is a cross-sectional view illustrating a modified example of the correction step in the method for manufacturing the organic EL display device according to the first embodiment of the disclosure.

Next, a method for manufacturing the organic EL display device 50a according to the present embodiment will be described. Here, FIG. 10 is a cross-sectional view illustrating a correction step in the method for manufacturing the organic EL display device 50a (50aa). FIG. 11 is a plan view illustrating the correction step in the method for manufacturing the organic EL display device 50a. FIG. 12 is a plan view illustrating a correction step in a method for manufacturing a modified example of the organic EL display device 50a. FIG. 13 is a cross-sectional view illustrating a modified example of the correction step in the method for manufacturing an organic EL display device 50a (50ab). Note that the method for manufacturing the organic EL display device 50a according to the present embodiment includes a TFT layer forming step, an organic EL element layer forming step, a sealing film forming step, a through-hole forming step, a disconnection detection step, and the correction step.

Thin Film Transistor Layer Forming Step (TFT Layer Forming Step)

First, for example, a non-photosensitive polyimide resin (thickness of approximately 2 µm) is applied onto a glass substrate, and then the applied film is prebaked and postbaked to form the first resin substrate layer 6.

Subsequently, an inorganic insulating film (thickness of approximately 1000 nm) such as a silicon oxide film is formed on the entire substrate layer on which the first resin substrate layer 6 is formed, for example, by plasma chemical vapor deposition (CVD), thereby forming the in-substrate inorganic insulating film 7.

Further, for example, a non-photosensitive polyimide resin (thickness of approximately 2 µm) is applied onto the entire substrate on which the in-substrate inorganic insulating film 7 is formed, and then the applied film is prebaked and postbaked, thereby forming the second resin substrate layer 8 to form the resin substrate layer 10.

Thereafter, an inorganic insulating film (thickness of approximately 1000 nm) such as a silicon oxide film is formed on the entire substrate on which the resin substrate layer 10 is formed, for example, by plasma CVD to form the base coat film 11.

Subsequently, for example, an amorphous silicon film (thickness of approximately 50 nm) is formed on the entire substrate on which the base coat film 11 is formed, by plasma CVD, the amorphous silicon film is crystallized by laser annealing or the like to form a semiconductor film of a polysilicon film, and then, the semiconductor film is patterned to form the semiconductor layer 12a and the like.

Thereafter, an inorganic insulating film (approximately 100 nm) such as a silicon oxide film is formed on the entire substrate on which the semiconductor layer 12a and the like are formed, for example, by plasma CVD, to form the gate insulating film 13 to cover the semiconductor layer 12a and the like.

Further, an aluminum film (thickness of approximately 350 nm), a molybdenum nitride film (thickness of approximately 50 nm), and the like are sequentially formed on the entire substrate on which the gate insulating film 13 is formed, for example, by sputtering, and then a metal layered film thereof is patterned to form the first wiring line layer such as the gate line 14g (display wiring line forming step).

Subsequently, using the first wiring line layer as a mask, impurity ions are doped to form an intrinsic region and a conductor region in the semiconductor layer 12a and the like.

Thereafter, an inorganic insulating film (thickness of approximately 100 nm) such as a silicon oxide film is formed onto the entire substrate on which the semiconductor layers 12a and the like with the intrinsic region and the conductor region are formed, for example, by plasma CVD to form the first interlayer insulating film 15.

Subsequently, an aluminum film (thickness of approximately 350 nm), a molybdenum nitride film (thickness of approximately 50 nm), and the like are sequentially formed on the entire substrate on which the first interlayer insulating film 15 is formed, for example, by sputtering, and then, a metal layered film thereof is patterned to form the second wiring line layer such as the upper conductive layer 16c.

Further, an inorganic insulating film (thickness of approximately 500 nm) such as a silicon oxide film is formed on the entire substrate on which the second wiring line layer is formed, for example, by plasma CVD to form the second interlayer insulating film 17.

Thereafter, the gate insulating film 13, the first interlayer insulating film 15, and the second interlayer insulating film 17 are patterned to form a contact hole.

Further, at the bending portion B, the base coat film 11, the gate insulating film 13, the first interlayer insulating film 15, and the second interlayer insulating film 17 are removed to form the linear slit Sb in the base coat film 11, the gate insulating film 13, the first interlayer insulating film 15, and the second interlayer insulating film 17, and in the non-display region N, the base coat film 11, the gate insulating film 13, the gate line 14g, the first interlayer insulating film 15, and the second interlayer insulating film 17 are partially removed (lower inorganic insulating layer forming step).

Thereafter, in the non-display region N, the second resin substrate layer 8 exposed from the base coat film 11, the gate insulating film 13, the gate line 14g, the first interlayer insulating film 15, and the second interlayer insulating film 17 is ashed to form the inner slits Sa, thereby forming the inner protruding portion C (inner protruding portion forming step).

Subsequently, an inorganic insulating film (thickness of approximately 500 nm) such as a silicon oxide film is formed on the entire substrate on which the inner slits Sa are formed, for example, by plasma CVD, and then, the inorganic insulating film is patterned to form the third interlayer insulating film 18. In the present embodiment, the configuration in which the third interlayer insulating film 18 is provided in the non-display region N, the display region D, and the frame region F is illustrated, but the third interlayer insulating film 18 may be provided only in the non-display region N.

Further, for example, a photosensitive polyimide resin is applied to the entire substrate on which the third interlayer insulating film 18 is formed, and then the applied film is prebaked, exposed, developed, and postbaked to form the filling layer R in the linear slit Sb at the bending portion B and the filling layer once inside the inner slit Sa.

Subsequently, a titanium film (thickness of approximately 30 nm), an aluminum film (thickness of approximately 300 nm), a titanium film (thickness of approximately 50 nm), and the like are sequentially formed on the entire substrate on which the filling layer R and the like are formed, for example, by sputtering, and then, a metal layered film thereof is patterned to form the third wiring line layer such as the source line 19f.

Further, a photosensitive polyimide resin (thickness of approximately 2 μm) is applied to the entire substrate on which the third wiring line layer is formed, for example, by spin coating or slit coating, and then, the applied film is prebaked, exposed, developed, and postbaked to form the first flattening film 20a and the like.

Thereafter, a titanium film (thickness of approximately 30 nm), an aluminum film (thickness of approximately 300 nm), a titanium film (thickness of approximately 50 nm), and the like are sequentially formed on the entire substrate on which the first flattening film 20a and the like are formed, for example, by sputtering, and then, a metal layered film thereof is patterned to form the fourth wiring line layer such as the power source line 21a.

Finally, a photosensitive polyimide resin film (thickness of approximately 2 μm) is applied onto the entire substrate on which the fourth wiring line layer is formed, for example, by spin coating or slit coating, and then, the applied film is prebaked, exposed, developed, and postbaked, thereby forming the second flattening film 22a and the like.

As described above, the TFT layer 30 can be formed.

Organic EL Element Layer Forming Step (Light-Emitting Element Layer Forming Step)

On the second flattening film 22a of the TFT layer 30 formed in the TFT layer forming step described above, the first electrode 31a, the edge cover 32a, the organic EL layer 33 (hole injection layer 1, hole transport layer 2, light-emitting layer 3, electron transport layer 4, and electron injection layer 5), and the second electrode 34a are formed using a well-known method to form the organic EL element layer 35. Here, when the hole injection layer 1, the hole transport layer 2, the electron transport layer 4, the electron injection layer 5, and the second electrode 34a are formed by vapor deposition, the hole injection layer 1, the hole transport layer 2, the electron transport layer 4, the electron injection layer 5, and the second electrode 34a are separated by steps for each inner protruding portion C. Note that when forming the second electrode 34a, the first non-display conductive layer 34b and the second non-display conductive layer 34c are formed in the non-display region N (first non-display conductive layer forming step). After forming the edge cover 32a, the filling layer once formed inside the inner slit Sa is removed by ashing.

Sealing Film Forming Step

On the organic EL element layer 35 formed in the organic EL element layer forming step, the sealing film 40 (first inorganic sealing film 36, organic sealing film 37, and second inorganic sealing film 38) is formed using a well-known method. Thereafter, a protective sheet (not illustrated) is bonded on a substrate surface on which the sealing film 40 is formed, and then laser light is emitted from the glass substrate side of the resin substrate layer 10, so that the glass substrate is peeled off from a lower surface of the resin substrate layer 10, and further, a protective sheet (not illustrated) is bonded on the lower surface of the resin substrate layer 10 from which the glass substrate has been peeled off.

Through-Hole Forming Step

In the non-display region N, on the resin substrate layer 10 from which the glass substrate has been peeled off in the sealing film forming step, for example, laser light is emitted while annularly scanning to form the through-hole H. At this time, in the display region D, some of the plurality of gate lines 14g provided so as to extend parallel to each other are separated by the through-hole H formed in the non-display region N. Thereafter, when the organic EL display device 50a with the through-hole H formed is fixed, for example, to the inside of the housing, the electronic component 60 is installed so that the electronic component 60, such as a camera, is disposed on the back surface side of the through-hole H.

In the above-described manner, the organic EL display device 50a of the present embodiment can be manufactured.

Thereafter, when the following disconnection detection step is performed and a disconnection in the gate line 14g separated by the through-hole H is detected, the following correction step is performed.

Disconnection Detection Step

For the organic EL display device 50a manufactured as described above, a visual inspection, in which the wiring line pattern is optically inspected using, for example, a charge coupled device (CCD) camera or the like to detect a disconnection and its position in some of the plurality of gate lines 14g that are separated by the through-hole H.

Correction Step

As illustrated in FIG. 10, laser light L is emitted from the organic EL element layer 35 side (upper side in the figure) to overlapping portions between the gate line 14g, in which the disconnection was detected in the disconnection detection step, and the first non-display conductive layer 34b, at one end portion on the through-hole H side and another end portion on the through-hole H side. With this, at the respective irradiated locations, conductive portions M are formed to electrically connect the gate line 14g to the first non-display conductive layer 34b and the second non-display conductive layer 34c. Accordingly, the portion of the disconnected gate line 14g on the through-hole H side is electrically connected to the corresponding gate line 14g separated by the through-hole H via the first non-display conductive layer 34b and the second non-display conductive layer 34c. Here, a gate signal is input to one side of the gate line 14g separated by the through-hole H from a first gate drive circuit provided on one of the pair of facing sides in the frame region F, and a scanning signal is input to the other side of the gate line 14g separated by the through-hole H from a second gate drive circuit provided on another side of the pair of facing sides in the frame region F. Thus, when the gate signal is input from the first gate drive circuit to the portion of the disconnected gate line 14g on the display region D side, the gate signal is input from the second gate drive circuit to the portion of the disconnected gate line 14g on the through-hole H side.

As described above, in the organic EL display device 50a of the present embodiment, the disconnection in the gate line 14g separated by the through-hole H is corrected, and an organic EL display device 50aa can be obtained. Note that in the present embodiment, the configuration is illustrated in which one of the plurality of gate lines 14g separated by the through-hole H can be corrected. However, as illustrated in FIG. 12, the annular first non-display conductive layer 34b can be separated into two, a semicircular arc-shaped first non-display conductive layer 34ba on the upper side of the figure and a semicircular arc-shaped first non-display conductive layer 34bb on the lower side of the figure, and a configuration may be such that two of the plurality of gate lines 14g separated by the through-hole H can be corrected. In the present embodiment, the manufacturing method for emitting the laser light L from the organic EL element layer 35 side is exemplified. However, as illustrated in FIG. 13, by emitting the laser light L from the resin substrate layer 10 side (lower side in the figure), the gate line 14g and only the first non-display conductive layer 34b may be electrically connected to obtain an organic EL display device 50ab.

As described above, according to the organic EL display device 50a and the method for manufacturing thereof of the present embodiment, the island shaped non-display region N is provided inside the display region D, and the through-hole H is provided for installing the electronic component 60 through the resin substrate layer 10 in the non-display region N in the thickness direction. In the non-display region N, the plurality of inner protruding portions C are annularly provided so as to surround the through-hole H. Here, the lower resin layer 8a of each inner protruding portion C is separated by the plurality of inner slits Sa each formed annularly on the surface of the resin substrate layer 10 on the base coat film 11 side, and at the bottom portion of each inner slit Sa, the first non-display conductive layer 34b formed in the same layer with the same material as the second electrode 34a is provided. Further, the first non-display conductive layer 34b closest to the display region D is provided so as to overlap the gate line 14g separated by the through-hole H at the one end portion on the through-hole H side and at the other end portion on the through-hole H side. Thus, when a disconnection is detected in any one of the plurality of gate lines 14g separated by the through-hole H in the disconnection detection step, in the correction step, by irradiating, with the laser light L, the overlapping portions between the gate line 14g in which the disconnection was detected and the first non-display conductive layer 34b to electrically connect the gate line 14g and the first non-display conductive layer 34b, the disconnection of the gate line 14g can be corrected. Thus, the defect due to the disconnection in the gate line 14g separated by the through-hole H provided inside the display region D can be corrected, thereby ensuring the display quality and improving the manufacturing yield of the organic EL display device 50a.

According to the organic EL display device 50a and the method for manufacturing thereof of the present embodiment, in the non-display region N, the second non-display conductive layer 34c formed in the same layer with the same material as the second electrode 34a is provided on the display region D side of the plurality of inner slits Sa, and the second non-display conductive layer 34c is provided so as to overlap the gate line 14g separated by the through-hole H at the one end portion on the through-hole H side and the other end portion on the through-hole H side. Thus, when a disconnection is detected in any one of the plurality of gate lines 14g separated by the through-hole H in the disconnection detection step, in the correction step, by irradiating, with the laser light L, the overlapping portions between the gate line 14g in which the disconnection was detected and the first non-display conductive layer 34b and the second non-display conductive layer 34c to electrically connect the gate line 14g and the first non-display conductive layer 34b and the second non-display conductive layer 34c, the disconnection of the gate line 14g can be corrected more reliably.

Further, according to the organic EL display device 50a and the manufacturing method thereof of the present embodiment, among the plurality of inner slits Sa, the inner slit Sa closest to the first inner dam wall We is provided with the eaves portion J in which the base coat film 11, the gate insulating film 13, the first interlayer insulating film 15, and the second interlayer insulating film 17 protrude from the display region D side to the through-hole H side. Here, the eaves portion J in which the base coat film 11, the gate insulating film 13, the first interlayer insulating film 15, and the second interlayer insulating film 17 are layered is in contact with the first inorganic sealing film 36 of the sealing film 40 with the third interlayer insulating film 18 interposed therebetween. In addition, the lower resin layer 8a of each inner protruding portion C is in contact with the first inorganic sealing film 36 of the sealing film 40 with the third interlayer insulating film 18 interposed therebetween. Thus, the moisture and the like contained in the second resin substrate layer 8 are blocked by the third interlayer insulating film 18, and the sealing performance of the sealing film 40 in the non-display region N can be ensured due to contact between inorganic insulating films of the base coat film 11, the gate insulating film 13, the first interlayer insulating film 15, the second interlayer insulating film 17, the third interlayer insulating film 18, and the first inorganic sealing film 36, thereby suppressing the deterioration of each of the organic EL layers 33 in the organic EL element layer 35.

Second Embodiment

Figure 14:
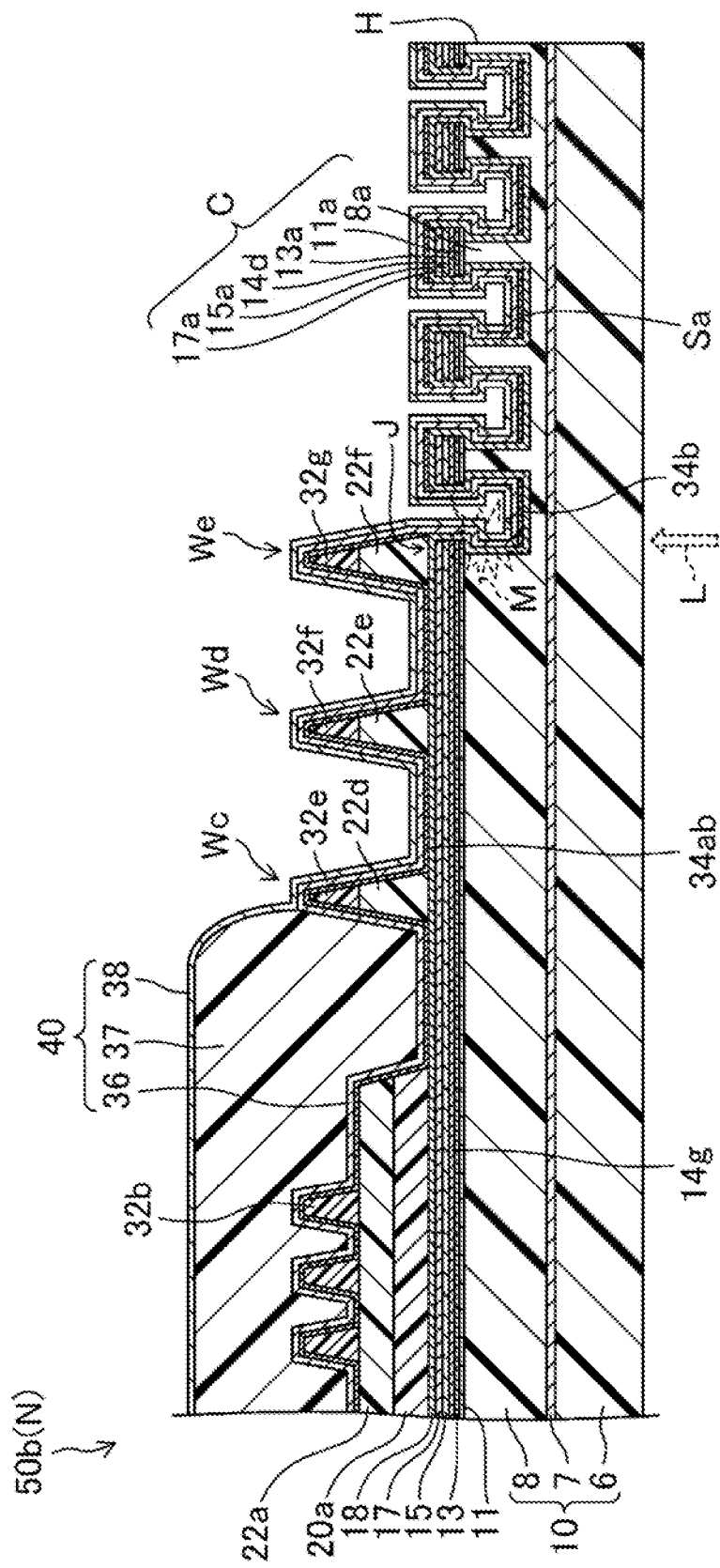
FIG. 14 is a cross-sectional view of a non-display region of an organic EL display device according to a second embodiment of the disclosure, and is a view corresponding to FIG. 7.

FIG. 14 illustrates a second embodiment of a display device and a method for manufacturing thereof according to the disclosure. Here, FIG. 14 is a cross-sectional view of a non-display region N of an organic EL display device 50b according to the present embodiment, and is a view corresponding to FIG. 7. Note that, in the following embodiments, portions identical to those in FIGS. 1 to 13 are denoted by the same reference signs, and their detailed descriptions are omitted.

In the first embodiments, the organic EL display devices 50a in which the first inner dam wall We and the second inner dam wall Wd are provided in the non-display region N is exemplified. However, in the present embodiment, the organic EL display device 50b in which a first inner dam wall Wc, a second inner dam wall Wd, and a third inner dam wall We are provided in the non-display region N is exemplified.

Similar to the organic EL display device 50a of the first embodiment described above, the organic EL display device 50b is provided with a display region D in which an image is displayed and a frame region F provided around the display region D.

As with the organic EL display device 50a of the first embodiment described above, the organic EL display device 50b includes a resin substrate layer 10, a TFT layer 30 provided on the resin substrate layer 10, an organic EL element layer 35 provided on the TFT layer 30, and a sealing film 40 provided covering the organic EL element layer 35.

As illustrated in FIG. 14, as with the organic EL display device 50a of the first embodiment described above, the organic EL display device 50b includes a plurality of inner protruding portions C each provided concentrically and annularly so as to surround a through-hole H in the non-display region N. Note that, in the organic EL display device 50b, as illustrated in FIG. 14, a second electrode 34ab corresponding to the second electrode 34a of the first embodiment is provided near the inner protruding portion C closest to the display region D, and the second non-display conductive layer 34c is not provided, so additional patterning by photolithography, dry etching, or the like is unnecessary. Here, as illustrated in FIG. 14, as with the organic EL display device 50a of the first embodiment described above, among a plurality of inner slits Sa, the inner slit Sa closest to the first inner dam wall Wc (the display region D side) is provided with an eaves portion J in which a base coat film 11, a gate insulating film 13, a gate line 14g, a first interlayer insulating film 15, and a second interlayer insulating film 17 protrude from the display region D side to the through-hole H side.

In addition, as illustrated in FIG. 14, the organic EL display device 50b includes, in the non-display region N, the first inner dam wall Wc provided annularly to surround the plurality of inner protruding portions C, the second inner dam wall Wd provided annularly in the periphery of the first inner dam wall Wc, and the third inner dam wall We provided as another inner dam wall annularly in the periphery of the second inner dam wall Wd.

As illustrated in FIG. 14, the third inner dam wall We includes a lower-side resin layer 22f formed in the same layer with the same material as a second flattening film 22a and an upper-side resin layer 32g provided on the lower-side resin layer 22f and formed in the same layer with the same material as an edge cover 32a. Note that, as illustrated in FIG. 14, the third inner dam wall We is disposed so as to overlap the eaves portion J in which the base coat film 11, the gate insulating film 13, the first interlayer insulating film 15, and the second interlayer insulating film 17 are layered.

As with the organic EL display device 50a of the first embodiment described above, the organic EL display device 50b includes, in the frame region F, a first outer dam wall Wa provided in a frame-like shape outside a trench G so as to surround the display region D, and a second outer dam wall Wb provided in a frame-like shape around the first dam wall Wa.

In addition, as with the organic EL display device 50a of the first embodiment described above, the organic EL display device 50b includes, in the frame region F, a first frame wiring line 19h provided in a frame-like shape as a third wiring line layer inside the trench G, with both end portions extending to the terminal portion T at the opening portion of the trench G.

In addition, as with the organic EL display device 50a of the first embodiment described above, the organic EL display device 50b includes, in the frame region F, a second frame wiring line 19i provided in a substantially C-like shape as the third wiring line layer outside the trench G, with both end portions extending to the terminal portion T.

Further, as with the organic EL display device 50a of the first embodiment described above, the organic EL display device 50b includes a plurality of peripheral photo spacers 32b provided in island shapes so as to protrude upward at both edge portions of the trench G in the frame region F.

As with the organic EL display device 50a of the first embodiment described above, the organic EL display device 50b includes, at a bending portion B, a filling layer R disposed to fill in a linear slit Sb formed in the base coat film 11, the gate insulating film 13, the first interlayer insulating film 15, the second interlayer insulating film 17, and the third interlayer insulating film 18, a plurality of lead wiring lines 19n disposed as the third wiring line layer on the filling layer R and the third interlayer insulating film 18, and a wiring line covering layer 20b disposed to cover the lead wiring lines 19n.

As with the organic EL display device 50a of the first embodiment described above, the organic EL display device 50b described above has flexibility and is configured to display an image by causing a light-emitting layer 3 of an organic EL layer 33 to emit light as appropriate via a first TFT 9a, a second TFT 9b, and a third TFT 9c in each subpixel P.

The organic EL display device 50b of the present embodiment can be manufactured by forming the lower-side resin layers 22f when forming the second flattening film 22a, and forming the upper-side resin layers 32g when forming the edge cover 32a in the method for manufacturing the organic EL display device 50a of the first embodiment. Further, when a disconnection is detected in any one of the plurality of gate lines 14g separated by the through-hole H in a disconnection detection step, as illustrated in FIG. 14, in a correction step, laser light L is emitted from a resin substrate layer 10 side (bottom side in the figure) to overlapping portions between the gate line 14g, in which the disconnection was detected in the disconnection detection step, at one end portion on the through-hole H side and another end portion on the through-hole H side and the first non-display conductive layer 34b. With this, at the respective irradiated locations, conductive portions M are formed to electrically connect the gate line 14g to the first non-display conductive layer 34b.

As described above, according to the organic EL display device 50b and the method for manufacturing thereof of the present embodiment, the island shaped non-display region N is provided inside the display region D, and the through-hole H is provided for installing an electronic component 60 through the resin substrate layer 10 in the non-display region N in a thickness direction. In the non-display region N, the plurality of inner protruding portions C are annularly provided so as to surround the through-hole H. Here, the lower resin layer 8a of each inner protruding portion C is separated by the plurality of inner slits Sa each formed annularly on the surface of the resin substrate layer 10 on the base coat film 11 side, and at the bottom portion of each inner slit Sa, the first non-display conductive layer 34b formed in the same layer with the same material as the second electrode 34ab is provided. Further, the first non-display conductive layer 34b closest to the display region D is provided so as to overlap the gate line 14g separated by the through-hole H at the one end portion on the through-hole H side and at the other end portion on the through-hole H side. Thus, when a disconnection is detected in any one of the plurality of gate lines 14g separated by the through-hole H in the disconnection detection step, in the correction step, by irradiating, with the laser light L, the overlapping portions between the gate line 14g in which the disconnection was detected and the first non-display conductive layer 34b to electrically connect the gate line 14g and the first non-display conductive layer 34b, the disconnection of the gate line 14g can be corrected. Thus, the defect due to the disconnection in the gate line 14g separated by the through-hole H provided inside the display region D can be corrected, thereby ensuring the display quality and improving the manufacturing yield of the organic EL display device 50b.

Further, according to the organic EL display device 50b and the manufacturing method thereof of the present embodiment, among the plurality of inner slits Sa, the inner slit Sa closest to the first inner dam wall We is provided with the eaves portion J in which the base coat film 11, the gate insulating film 13, the first interlayer insulating film 15, and the second interlayer insulating film 17 protrude from the display region D side to the through-hole H side. Here, the eaves portion J in which the base coat film 11, the gate insulating film 13, the first interlayer insulating film 15, and the second interlayer insulating film 17 are layered is in contact with the first inorganic sealing film 36 of the sealing film 40 with the third interlayer insulating film 18 interposed therebetween. In addition, the lower resin layer 8a of each inner protruding portion C is in contact with the first inorganic sealing film 36 of the sealing film 40 with the third interlayer insulating film 18 interposed therebetween. Thus, the moisture and the like contained in the second resin substrate layer 8 are blocked by the third interlayer insulating film 18, and the sealing performance of the sealing film 40 in the non-display region N can be ensured due to contact between inorganic insulating films of the base coat film 11, the gate insulating film 13, the first interlayer insulating film 15, the second interlayer insulating film 17, the third interlayer insulating film 18, and the first inorganic sealing film 36, thereby suppressing the deterioration of each of the organic EL layers 33 in the organic EL element layer 35.

Other Embodiments

In each of the embodiments described above, the organic EL display device capable of correcting the disconnection in the gate line is exemplified, but the disclosure can also be applied to an organic EL display device capable of correcting disconnections in other display wiring lines such as the light emission control lines, the source lines and the like.

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

In addition, in each of the embodiments described above, the organic EL display device is exemplified and described as a display device. The disclosure is also applicable to a display device including a plurality of light-emitting elements that are driven by an electrical current. For example, the disclosure is applicable to a display device including quantum-dot light emitting diodes (QLEDs) that are light-emitting elements using a quantum dot-containing layer.

INDUSTRIAL APPLICABILITY

As described above, the disclosure is useful for a flexible display device.

The invention claimed is:
1. A display device comprising:
a resin substrate layer;
a thin film transistor layer provided on the resin substrate layer and including a lower inorganic insulating film, a lower wiring line layer, and an organic insulating film layered in order; and
a light-emitting element layer provided on the thin film transistor layer, and including a plurality of first electrodes, a plurality of light-emitting function layers, and a common second electrode layered in order corresponding to a plurality of subpixels constituting a display region,
wherein a non-display region with an island shape is provided inside the display region,
a through-hole passing through the resin substrate layer in the non-display region in a thickness direction is provided,
an electronic component is installed in the through-hole,
in the non-display region, a plurality of inner protruding portions each are provided to surround the through-hole,
each of the plurality of inner protruding portions includes a lower resin layer constituted by the resin substrate layer and a lower inorganic insulating layer provided on the lower resin layer and formed in the same layer with the same material as the lower inorganic insulating film,
the lower resin layer of each of the plurality of the inner protruding portions is separated by a plurality of inner slits each formed on a surface of the resin substrate layer on a side of the lower inorganic insulating film,
the lower inorganic insulating layer is provided to protrude from the lower resin layer in an eaves shape to at least one of a side of the through-hole and a side of the display region,
in the display region, a plurality of display wiring lines are provided to extend in parallel to each other as the lower wiring line layer,
some of the plurality of display wiring lines are separated by the through-hole,
at a bottom portion of each of the plurality of inner slits, a first non-display conductive layer is formed in the same layer with the same material as the second electrode, and
the first non-display conductive layer closest to the display region is provided to overlap each of the some of the plurality of display wiring lines separated by the through-hole at one end portion on a side of the through-hole and another end portion on a side of the through-hole.

2. The display device according to claim 1,
wherein each of the plurality of inner slits is annularly provided to surround the through-hole.

3. The display device according to claim 2,
wherein the first non-display conductive layer is provided annularly.

4. The display device according to claim 1,
wherein the first non-display conductive layer is provided separately in two.

5. The display device according to claim 1, comprising:
a sealing film provided to cover the light-emitting element layer, and including a first inorganic sealing film, an organic sealing film, and a second inorganic sealing film layered in order;
in a frame region around the display region, an outer dam wall provided to surround the display region and overlapping an outer peripheral end portion of the organic sealing film; and
in the non-display region, an inner dam wall provided to surround the plurality of inner protruding portions, and to overlap an inner peripheral end portion of the organic sealing film,
wherein among the plurality of inner slits, an inner slit closest to the inner dam wall is provided with an eaves portion including the lower inorganic insulating film protruding from the side of the display region to the side of the through-hole.

6. The display device according to claim 5,
wherein the thin film transistor layer includes an upper inorganic insulating film provided on an upper side of the lower inorganic insulating film, and
the eaves portion is in contact with the first inorganic sealing film with the upper inorganic insulating film interposed between the eaves portion and the first inorganic sealing film.

7. The display device according to claim 6,
wherein the lower resin layer of each of the plurality of inner protruding portions is in contact with the first inorganic sealing film with the upper inorganic insulating film interposed between the lower resin layer and the first inorganic sealing film.

8. The display device according to claim 5,
wherein in the non-display region, between the plurality of inner protruding portions and the inner dam wall, another inner dam wall is provided to overlap the eaves portion.

9. The display device according to claim 1,
wherein in the non-display region, a second non-display conductive layer formed in the same layer with the same material as the second electrode is provided on a side of the display region of the plurality of inner slits, and
the second non-display conductive layer is provided to overlap each of the some of the plurality of display wiring lines separated by the through-hole at the one end portion on the side of the through-hole and the other end portion on the side of the through-hole.

10. The display device according to claim 1,
wherein the resin substrate layer includes a first resin substrate layer provided on an opposite side to the thin film transistor layer, a second resin substrate layer provided on a side of the thin film transistor layer, and an in-substrate inorganic insulating film provided between the first resin substrate layer and the second resin substrate layer, and
the plurality of inner slits are each provided in the second resin substrate layer.

11. The display device according to claim 1,
wherein any one of the plurality of display wiring lines separated by the through-hole is disconnected, and
a portion of the display wiring line disconnected on a side of the through-hole is electrically connected to a corresponding one of the plurality of display wiring lines separated by the through-hole via the first non-display conductive layer closest to a side of the display region.

12. The display device according to claim 1,
wherein each of the plurality of light-emitting function layers is an organic electroluminescence layer.

13. A method for manufacturing a display device comprising:
forming a thin film transistor layer including a lower inorganic insulating film, a lower wiring line layer, and an organic insulating film layered in order on a resin substrate layer;
on the thin film transistor layer, forming a light-emitting element layer including a plurality of first electrodes, a plurality of light-emitting function layers, and a common second electrode layered in order corresponding to a plurality of subpixels constituting a display region; and
forming a through-hole passing through the resin substrate layer in a thickness direction in a non-display region defined in an island shape inside the display region,
an electronic component is installed in the through-hole,
wherein the forming a thin film transistor layer includes
in the display region, forming a plurality of display wiring lines extending parallel to each other as the lower wiring line layer,
by patterning the lower inorganic insulating film, in the non-display region, forming a plurality of lower inorganic insulating layers to surround the through-hole formed in the forming a through-hole, and
by forming a plurality of inner slits on a surface of the resin substrate layer exposed from the plurality of lower inorganic insulating layers and forming a plurality of lower resin layers by the resin substrate layer, forming a plurality of inner protruding portions in which each of the plurality of lower inorganic insulating layers is layered on each of the plurality of lower resin layers, and each of the plurality of lower inorganic insulating layers protrudes from each of the plurality of lower resin layers in an eaves-like shape to at least one of a side of the through-hole and a side of the display region, and
the forming a light-emitting element layer includes
when forming the second electrode, forming a first non-display conductive layer formed in the same layer with the same material as the second electrode at a bottom portion of each of the plurality of inner slits and overlapping some of the plurality of display wiring lines separated by the through-hole formed in the forming a through-hole, at one end portion on a side of the through-hole and another end portion on a side of the through-hole, and
the method comprising:
after the forming a through-hole, detecting a disconnection in some of the plurality of display wiring lines separated by the through-hole; and
by irradiating, with laser light, overlapping portions between the first non-display conductive layer and a display wiring line having the disconnection detected, at one end portion on the side of the through-hole and another end portion on the side of the through-hole, performing correcting for electrically connecting the display wiring line and the first non-display conductive layer.

14. The method for manufacturing a display device according to claim 13,
wherein the first non-display conductive layer is divided in two first non-display conductive layers,
in the detecting a disconnection, a disconnection in a display wiring line overlapping one of the two first non-display conductive layers is detected, and a disconnection in another display wiring line overlapping another of the two first non-display conductive layers is detected, and
in the performing correcting for electrically connecting, the laser light is emitted to overlapping portions between one end portion on the side of the through-hole and another end portion on the side of the through-hole in the display wiring line having the disconnection detected, and one first non-display conductive layer and/or another first non-display conductive layer.

15. The method for manufacturing a display device according to claim 13,
wherein in the performing correcting for electrically connecting, the laser light is emitted from a side of the light-emitting element layer.

16. The method for manufacturing a display device according to claim 13,
wherein in the performing correcting for electrically connecting, the laser light is emitted from a side of the resin substrate layer.

17. The method for manufacturing a display device according to claim 13,
wherein each of the plurality of light-emitting function layers is an organic electroluminescence layer.

* * * * *